(12) United States Patent
Hanaki et al.

(10) Patent No.: US 10,361,379 B2
(45) Date of Patent: Jul. 23, 2019

(54) PHOTOELECTRIC CONVERSION ELEMENT, PHOTOSENSOR, AND IMAGING DEVICE

(71) Applicant: FUJIFILM CORPORATION, Tokyo (JP)

(72) Inventors: Naoyuki Hanaki, Kanagawa (JP); Yosuke Yamamoto, Kanagawa (JP); Daigo Sawaki, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 268 days.

(21) Appl. No.: 15/234,365

(22) Filed: Aug. 11, 2016

(65) Prior Publication Data

US 2016/0351830 A1 Dec. 1, 2016

Related U.S. Application Data

(63) Continuation of application No. PCT/JP2015/050387, filed on Jan. 8, 2015.

(30) Foreign Application Priority Data

Feb. 14, 2014 (JP) ................... 2014-026853

(51) Int. Cl.
*H01L 27/00* (2006.01)
*H01L 51/00* (2006.01)
(Continued)

(52) U.S. Cl.
CPC ........ *H01L 51/0072* (2013.01); *H01L 27/307* (2013.01); *H01L 51/006* (2013.01);
(Continued)

(58) Field of Classification Search
CPC ... H01L 27/307; H01L 27/301; H01L 27/146; H01L 27/14601; H01L 31/18;
(Continued)

(56) References Cited

U.S. PATENT DOCUMENTS 8,338,691 B2 * 12/2012 Mitsui .................. B82Y 10/00
136/243
9,085,537 B2 7/2015 Nomura et al.
(Continued)

FOREIGN PATENT DOCUMENTS

JP 2011-187937 A 9/2011
JP 2011-228623 A 11/2011
(Continued)

OTHER PUBLICATIONS

KR Office Action dated Dec. 12, 2017, from corresponding KR Appl No. 10-2016-7021961, with English translation, 77 pp.
(Continued)

*Primary Examiner* — Nikolay K Yushin
(74) *Attorney, Agent, or Firm* — Studebaker & Brackett PC

(57) ABSTRACT

An object of the present invention is to provide a photoelectric conversion element which exhibits excellent heat resistance and responsiveness, and a photosensor and an imaging device which include the photoelectric conversion element. The photoelectric conversion element of the present invention includes: a transparent conductive film; a conductive film; and a photoelectric conversion film and an electron blocking layer which are disposed between the transparent conductive film and the conductive film, wherein
(Continued)

the electron blocking layer contains a compound represented by the following Formula (1).

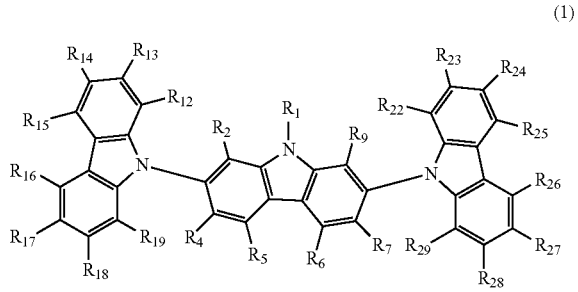

(1)

16 Claims, 2 Drawing Sheets

(51) Int. Cl.
- H01L 31/00 (2006.01)
- H01L 27/30 (2006.01)
- H01L 51/42 (2006.01)

(52) U.S. Cl.
CPC ...... *H01L 51/0052* (2013.01); *H01L 51/0054* (2013.01); *H01L 51/0094* (2013.01); *H01L 51/4273* (2013.01); *H01L 27/301* (2013.01); *H01L 51/424* (2013.01); *H01L 51/4253* (2013.01)

(58) Field of Classification Search
CPC ..... H01L 31/29; H01L 31/0224; H01L 31/20; H01L 51/4273; H01L 51/0072; H01L 51/0052; H01L 51/0054; H01L 51/006; H01L 51/0094; H01L 51/424; H01L 51/4253

See application file for complete search history.

(56) References Cited

U.S. PATENT DOCUMENTS

| 2009/0223566 A1* | 9/2009 | Mitsui ............... B82Y 10/00 136/263 |
| 2012/0098079 A1 | 4/2012 | Suzuki |
| 2012/0298846 A1 | 11/2012 | Nomura et al. |
| 2013/0020566 A1 | 1/2013 | Suzuki |
| 2014/0374733 A1 | 12/2014 | Hirai et al. |

FOREIGN PATENT DOCUMENTS

| JP | 2012-094660 A | 5/2012 |
| JP | 2013-214730 A | 10/2013 |

OTHER PUBLICATIONS

International Search Report issued in PCT/JP2015/050387; dated Mar. 17, 2015.
Notification of Transmittal of Translation of the International Preliminary Report on Patentability and Translation of Written Opinion of the International Searching Authority; PCT/JP2015/050387 dated Aug. 25, 2016.

* cited by examiner

PHOTOELECTRIC CONVERSION ELEMENT, PHOTOSENSOR, AND IMAGING DEVICE

CROSS-REFERENCE TO RELATED APPLICATIONS

This application is a Continuation of PCT International Application No. PCT/JP2015/050387 filed on Jan. 8, 2015, which claims priority under 35 U.S.C. § 119(a) to Japanese Patent Application No. 2014-026853 filed on Feb. 14, 2014. The above application is hereby expressly incorporated by reference, in its entirety, into the present application.

BACKGROUND OF THE INVENTION

The present invention relates to a photoelectric conversion element, a photosensor, and an imaging device.

A conventional photosensor is an element in which a photodiode (PD) is formed in a semiconductor substrate such as silicon (Si), and as a solid-state imaging device, a planar solid-state imaging device, in which PDs are two-dimensionally arranged and signal charge generated by each PD is read out by a circuit, is widely used.

In order to obtain a color solid-state imaging device, a structure in which color filters that transmit light of a specific wavelength are arranged in a light incident surface of the planar solid-state imaging device is generally used. Currently, a single plate solid-state imaging device, in which color filters that transmit blue (B) light, green (G) light, and red (R) light are regularly arranged on each of the two-dimensionally arranged PDs, is well known and is widely used in a digital camera and the like.

Meanwhile, a technique is known in which, for the purpose of suppressing dark currents or the like, an electron blocking layer is introduced into a photoelectric conversion element used in a photosensor or a solid-state imaging device (for example, JP 2012-94660 A).

SUMMARY OF THE INVENTION

In a case where a photoelectric conversion element is used for various applications such as imaging devices or photosensors, in view of process suitability, the photoelectric conversion element is required to exhibit high heat resistance. For example, in a case where an imaging device is formed, the process includes a large number of steps in which heat treatment is performed, such as steps of installing a color filter, installing a protective film, and subjecting an element to soldering. Therefore, it is required for the photoelectric conversion element to still exhibit excellent characteristics (high photoelectric conversion efficiency and low dark current characteristics) after going through the above steps.

In recent years, further improvement of responsiveness has been required for imaging devices or photosensors, and accordingly, the photoelectric conversion element used in the imaging devices or photosensors has also been required to be further improved in terms of responsiveness.

In this situation, the inventors of the present invention prepared a photoelectric conversion element by using the compound used in the examples of JP 2012-94660 A. As a result, they found that dark currents increase due to heat treatment, and it has become evident that the rate of increase does not satisfy the currently required level of heat resistance. Furthermore, as a result of evaluating the responsiveness of the prepared element, it has become evident that the element does not satisfy the currently required level of responsiveness.

Therefore, the present invention has been made in consideration of the aforementioned current circumstances, and object thereof is to provide a photoelectric conversion element which exhibits excellent heat resistance and responsiveness, and a photosensor and an imaging device which include the photoelectric conversion element.

In order to achieve the above object, the inventors of the present invention conducted intensive investigation. As a result, they found that the use of a compound represented by Formula (1), which will be described later, in an electron blocking layer results in excellent heat resistance and responsiveness, and accomplished the present invention. That is, the inventors of the present invention found that the above object can be achieved by the following constitution.

(1) A photoelectric conversion element comprising: a transparent conductive film; a conductive film; and a photoelectric conversion film and an electron blocking layer which are disposed between the transparent conductive film and the conductive film, wherein the electron blocking layer contains a compound represented by Formula (1) described below.

(2) The photoelectric conversion element according to (1), wherein $R_1$ in Formula (1) described below is a condensed-ring aromatic hydrocarbon group which may have a substituent or a group which is represented by Formula (2) described below.

(3) The photoelectric conversion element according to (1) or (2), wherein $R_1$ in Formula (1) described below is a condensed-ring aromatic hydrocarbon group which may have a substituent, and the condensed ring constituting the condensed-ring aromatic hydrocarbon group consists of four or more benzene rings.

(4) The photoelectric conversion element according to any one of (1) to (3), wherein $R_1$ in Formula (1) described below is a group represented by Formula (A) described below.

(5) The photoelectric conversion element according to (1), wherein $R_1$ in Formula (1) described below is a group represented by Formula (B) described below.

(6) The photoelectric conversion element according to any one of (1) to (3), wherein $R_1$ in Formula (1) described below is a group represented by Formula (C) described below.

(7) The photoelectric conversion element according to any one of (1) to (6), wherein the photoelectric conversion film contains a compound represented by Formula (W) described below.

(8) A photosensor comprising the photoelectric conversion element according to any one of (1) to (7).

(9) An imaging device comprising the photoelectric conversion element according to any one of (1) to (7).

As shown below, according to the present invention, it is possible to provide a photoelectric conversion element which exhibits excellent heat resistance and responsiveness, and a photosensor and an imaging device which include the photoelectric conversion element.

BRIEF DESCRIPTION OF THE DRAWINGS

Each of FIG. 1A

DETAILED DESCRIPTION OF THE INVENTION

[Photoelectric Conversion Element]

The photoelectric conversion element of the present invention has a transparent conductive film, a conductive film, and a photoelectric conversion film and an electron blocking layer which are disposed between the transparent conductive film and the conductive film. The electron blocking layer contains a compound represented by Formula (1) which will be described later.

Figure 1A:
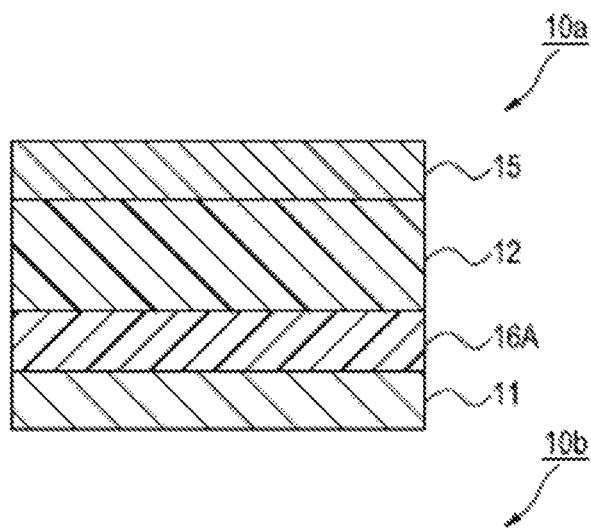
FIG. 1B is a schematic cross-sectional view showing an example of configuration of a photoelectric conversion element.
Figure 1B:
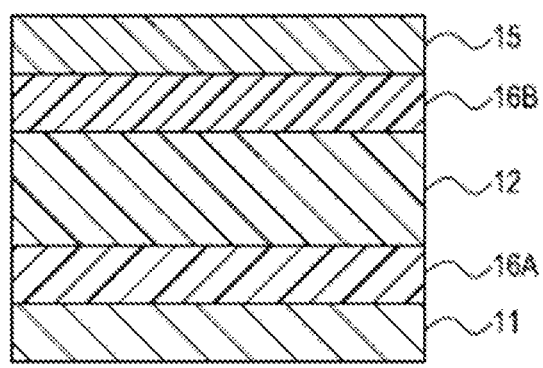

Hereinafter, the photoelectric conversion element of the present invention will be described with reference of drawings. FIGS. 1A and 1B are schematic cross-sectional views of an embodiment of the photoelectric conversion element of the present invention.

A photoelectric conversion element 10a shown in FIG. 1A has a configuration in which a conductive film 11 (hereinafter, also referred to as a "lower electrode") that functions as a lower electrode, an electron blocking layer 16A that is formed on the lower electrode 11, a photoelectric conversion film 12 that is formed on the electron blocking layer 16A, and a transparent conductive film 15 (hereinafter, also referred to as a "upper electrode") that functions as an upper electrode are laminated on one another in this order.

FIG. 1B shows an example of configuration of another photoelectric conversion element. A photoelectric conversion element 10b shown in FIG. 1B has a configuration in which on the lower electrode 11, the electron blocking layer 16A, the photoelectric conversion film 12, a hole blocking layer 16B, and the upper electrode 15 are laminated in this order. The electron blocking layer 16A, the photoelectric conversion film 12, and the hole blocking layer 16B in FIG. 1A and FIG. 1B may be laminated in an inverse order, according to the use and characteristics of the element.

In the configuration of the photoelectric conversion element 10a (10b), it is preferable for light to enter the photoelectric conversion film 12 through the transparent conductive film 15.

Furthermore, when the photoelectric conversion element 10a (10b) is used, an electric field can be applied thereto. In this case, the conductive film 11 and the transparent conductive film 15 constitute a pair of electrodes. It is preferable to apply an electric field of $1\times10^{-5}$ V/cm to $1\times10^{7}$ V/cm between the pair of electrodes, and it is more preferable to apply an electric field of $1\times10^{-4}$ V/cm to $1\times10^{7}$ V/cm between the pair of electrodes. From the viewpoint of performance and power consumption, it is preferable to apply an electric field of $1\times10^{-4}$ V/cm to $1\times10^{6}$ V/cm, and it is more preferable to apply an electric field of $1\times10^{-3}$ V/cm to $5\times10^{5}$ V/cm.

Regarding a voltage applying method, it is preferable to apply voltage such that the electron blocking layer 16A becomes a negative pole, and the photoelectric conversion film 12 becomes a positive pole, in FIG. 1A and FIG. 1B. When the photoelectric conversion element 10a (10b) is used as a photosensor or included in an imaging device, voltage can be applied by the same method as described above.

Hereinafter, embodiments of the respective layers (electron blocking layer, photoelectric conversion film, electrodes, hole blocking layer, and the like) configuring the photoelectric conversion element of the present invention will be described in detail.

First, the electron blocking layer will be described in detail.

[Electron Blocking Layer]

The electron blocking layer included in the photoelectric conversion element of the present invention is a layer that is disposed between the transparent conductive film and the conductive film which will be described later, and contains a compound (hereinafter, referred to as a specific compound as well) represented by Formula (1) which will be described later.

It is considered that, because the electron blocking layer contains the specific compound, the photoelectric conversion element of the present invention exhibits excellent heat resistance and responsiveness. The reason is unclear but is assumed to be as below.

As shown in Formula (1) which will be described later, the specific compound contained in the electron blocking layer has a structure in which three carbazole structures are directly bonded to each other in specific positions. Furthermore, the central carbazole structure has a specific aromatic hydrocarbon group or aromatic heterocyclic group. Because the specific compound has such a structure, packing is easily formed in the electron blocking layer. Presumably, as a result, structural change resulting from heat does not easily occur in the electron blocking layer, and thus the electron blocking layer exhibits excellent heat resistance. In addition, presumably, holes can be rapidly transported in the electron blocking layer, and thus the electron blocking layer exhibits excellent responsiveness.

Particularly, the point that the central carbazole structure of the specific compound has a specific aromatic hydrocarbon group or aromatic heterocyclic group is considered to be one of the features of the compound. That is, presumably, because the central carbazole structure has a "substituent having an aromatic structure (aromatic hydrocarbon structure or aromatic heterocyclic structure) in which the total number of carbon atoms thereof is within a specific range", appropriate planarity is maintained within a range in which the carbazole structures on the left and right sides do not become steric hindrance, and thus the aforementioned actions arise efficiently.

The above presumptions are also supported by a fact given by comparative examples, which will be described later. That is, even if the compound has a structure in which three carbazole structures are directly bonded to each other, in a case where they are not bonded to each other in specific positions (Comparative Examples 2 and 5) or in a case where the central carbazole structure does not have the aforementioned specific substituent (Comparative Examples 1, 3, 4, and 6), heat resistance and responsiveness become insufficient.

<Specific Compound>

In the photoelectric conversion element of the present invention, the electron blocking layer contains a compound (specific compound) represented by the following Formula (1).

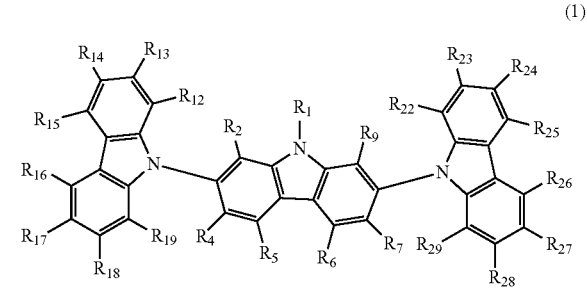

In Formula (1), $R_1$ represents an aromatic hydrocarbon group or an aromatic heterocyclic group which may have a substituent.

The number of carbon atoms of the aromatic hydrocarbon group and the aromatic heterocyclic group is preferably 6 to 20.

Specific examples of rings constituting the aromatic hydrocarbon group include a benzene ring, a naphthalene ring, an anthracene ring, a phenanthrene ring, a fluorene ring, a triphenylene ring, a tetracene ring, a pyrene ring, and the like.

Specific examples of rings constituting the aromatic heterocyclic group include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyran ring, a thiin ring, a pyridine ring, a piperidine ring, an oxazine ring, a morpholine ring, a thiazine ring, a pyridazine ring, a pyrimidine ring, a pyrazine ring, a piperazine ring, a triazine ring, a benzofuran ring, an isobenzofuran ring, a benzothiophene ring, a thienothiophene ring, an indole ring, an indoline ring, an isoindole ring, a benzoxazole ring, a benzothiazole ring, an indazole ring, a benzimidazole ring, a quinoline ring, an isoquinoline ring, a cinnoline ring, a phthalazine ring, a quinazoline ring, a quinoxaline ring, a dibenzofuran ring, a dibenzothiophene ring, a carbazole ring, a xanthene ring, an acridine ring, a phenanthridine ring, a phenanthroline ring, a phenazine ring, a phenoxazine ring, a thianthrene ring, an indolizine ring, a quinolizine ring, a quinuclidine ring, a naphthyridine ring, a purine ring, a pteridine ring, and the like.

Examples of the substituent include a substituent W which will be described later. In a case where the aromatic hydrocarbon group or the aromatic heterocyclic group has a plurality of substituents, the plurality of substituents may form a ring by being bonded to each other.

The number of carbon atoms (hereinafter, referred to as total number of carbon atoms as well) of the aromatic hydrocarbon structure and the aromatic heterocyclic structure contained in $R_1$ is 15 to 30 in total. That is, the number of carbon atoms constituting the aromatic hydrocarbon structure and the aromatic heterocyclic structure contained in $R_1$ is 15 to 30 in total. Because the total number of carbon atoms is equal to or less than 30, the specific compound also has excellent vapor deposition properties.

In a case where $R_1$ has a substituent, the number of carbon atoms of an aromatic hydrocarbon structure and an aromatic heterocyclic structure contained in the substituent is also counted. The number of carbon atoms of structures such as an aliphatic hydrocarbon structure other than the aromatic hydrocarbon structure and the aromatic heterocyclic structure is not counted.

For example, in a case of compound (2) used in examples which will be described later, the total number of carbon atoms thereof equals "16" which is the number of carbon atoms of a pyrene ring. Furthermore, in a case of compound (3), $R_1$ is a phenyl group, which is an aromatic hydrocarbon group, having an anthryl group as a substituent, and the total number of carbon atoms thereof equals "20" which is the sum of "6" as the number of carbon atoms of a benzene ring and "14" as the number of carbon atoms of an anthracene ring.

The total number of carbon atoms of the aromatic hydrocarbon structure and the aromatic heterocyclic structure contained in $R_1$ is preferably 16 to 26.

In Formula (1), each of $R_2$, $R_4$ to $R_7$, $R_9$, $R_{12}$ to $R_{19}$, and $R_{22}$ to $R_{29}$ independently represents a hydrogen atom or a substituent.

Examples of the substituent include a substituent W which will be described later, and the like. Among these, a tert-butyl group is preferable.

Preferred Embodiment of $R_1$ $R_1$ is preferably a condensed-ring aromatic hydrocarbon group which may have a substituent or a group which is represented by the following Formula (2).

The condensed-ring aromatic hydrocarbon group is not particularly limited as long as the aforementioned total number of carbon atoms is within a range of 15 to 30. Specific examples of the condensed ring constituting the condensed-ring aromatic hydrocarbon group include a naphthalene ring, an anthracene ring, a phenanthrene ring, a fluorene ring, an acenaphthylene ring, a chrysene ring, a fluoranthene ring, a pyrene ring, a triphenylene ring, a tetracene ring, a benzopyrene ring, a picene ring, a perylene ring, a pentacene ring, a hexacene ring, a heptacene ring, a coronene ring, and the like. Among these, a condensed ring consisting of four or more benzene rings is preferable. Examples of the condensed-ring aromatic hydrocarbon group having a substituent include an acenaphthenyl group (a monovalent group of an acenaphthene ring) (an embodiment in which two methyl groups form a ring in a naphthyl group having two methyl groups).

The condensed-ring aromatic hydrocarbon group is preferably a group represented by the following Formula (A) because the better responsiveness is exhibited.

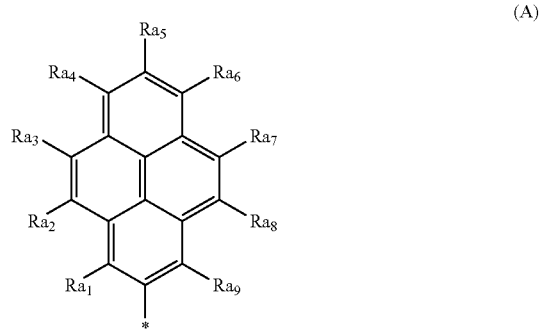

(A)

In Formula (A), each of $Ra_1$ to $Ra_9$ independently represents a hydrogen atom or a substituent. Examples of the substituent include a substituent W which will be described later. Among these, a tert-butyl group is preferable.

In Formula (A), * represents a binding position.

As another preferred embodiment of the condensed-ring aromatic hydrocarbon group, a group represented by the following Formula (C) is exemplified.

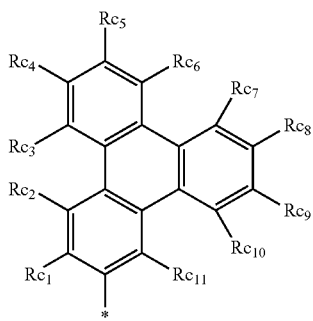

(C)

In Formula (C), each of $Rc_1$ to $Rc_{11}$ independently represents a hydrogen atom or a substituent. Examples of the substituent include a substituent W which will be described later.

In Formula (C), * represents a binding position.

(2)

In Formula (2), $Ar_{21}$ represents an (n+1)-valent aromatic hydrocarbon group or an (n+1)-valent aromatic heterocyclic group which may have a substituent. Specific examples of rings constituting the aromatic hydrocarbon group and specific examples of rings constituting the aromatic heterocyclic group are the same as the examples of rings constituting $R_1$ described above. Among these, a benzene ring is preferable. Examples of the substituent include a substituent W which will be described later.

In Formula (2), $Ar_{22}$ represents an aromatic hydrocarbon group or an aromatic heterocyclic group which may have a substituent. Specific examples of rings constituting the aromatic hydrocarbon group and specific examples of rings constituting the aromatic heterocyclic group are the same as the examples of rings constituting $R_1$ described above. Examples of the substituent include a substituent W which will be described later.

In Formula (2), n represents an integer of 1 to 3. n is particularly preferably an integer of 1 or 2. In a case where n is an integer of equal to or greater than 2, a plurality of $Ar_{22}$'s may be the same as or different from each other.

In Formula (2), * represents a binding position.

As another preferred embodiment of $R_1$, a group represented by the following Formula (B) is exemplified.

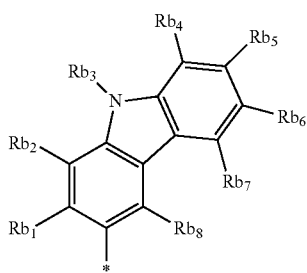

(B)

In Formula (B), each of $Rb_1$ to $Rb_8$ independently represents a hydrogen atom or a substituent. Examples of the substituent include a substituent W which will be described later. Among these, a tert-butyl group is preferable.

In Formula (B), * represents a binding position.

(Substituent W)

The substituent W in the present specification will be described.

Examples of the substituent W include a halogen atom, an alkyl group (for example, tert-butyl group) (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, an ureide group, a boronic acid group ($-B(OH)_2$), a phosphate group ($-OPO(OH)_2$), a sulfate group ($-OSO_3H$), and other known substituents.

The details of the substituents are described in paragraph [0023] of JP 2007-234651 A.

The molecular weight of the specific compound is preferably 500 to 2,000, more preferably 600 to 1,500, and particularly preferably 700 to 1,100.

In order to receive holes from a hole transporting material in the photoelectric conversion film without a barrier, the ionization potential (Ip) of the specific compound is preferably smaller than the Ip of the hole transporting material in the photoelectric conversion film. Particularly, in a case where an absorptive material that may exhibit sensitivity in a visible range is selected, in order for the specific compound to be suitable for more materials, the Ip of the specific compound is preferably equal to or less than 5.8 eV. If the Ip is equal to or less than 5.8 eV, an effect of demonstrating high charge collection efficiency without causing a barrier against charge transport is obtained.

The Ip is preferably equal to or greater than 4.9 eV, and more preferably equal to or greater than 5.0 eV.

The Ip of the specific compound can be measured by ultraviolet photoelectron spectroscopy (UPS) or a photoelectron spectrometer in air (for example, AC-2 manufactured by RIKEN KEIKI Co., Ltd.).

The Ip of the specific compound can be made fall into the above range by changing the substituent bonded to the skeleton thereof, and the like.

Specific examples of the compound (specific compound) represented by Formula (1) are shown below, but the present invention is not limited thereto. Herein, Ph in the specific examples represents a phenyl group.

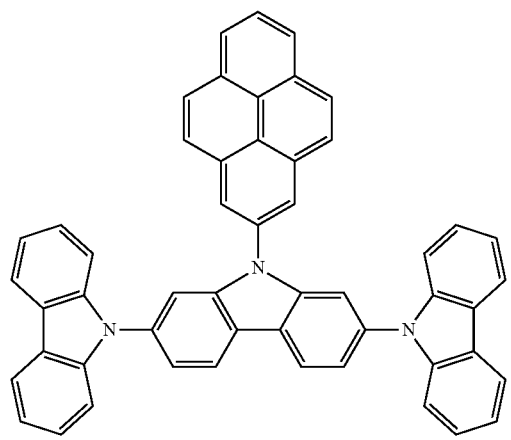
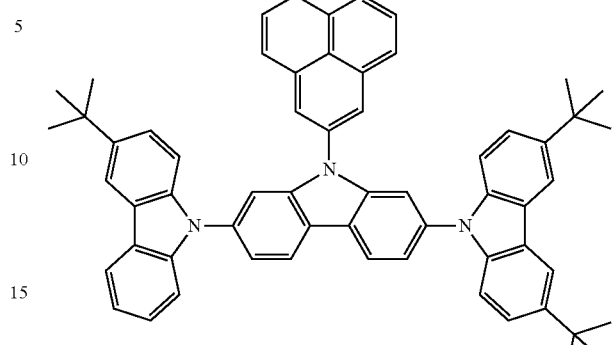
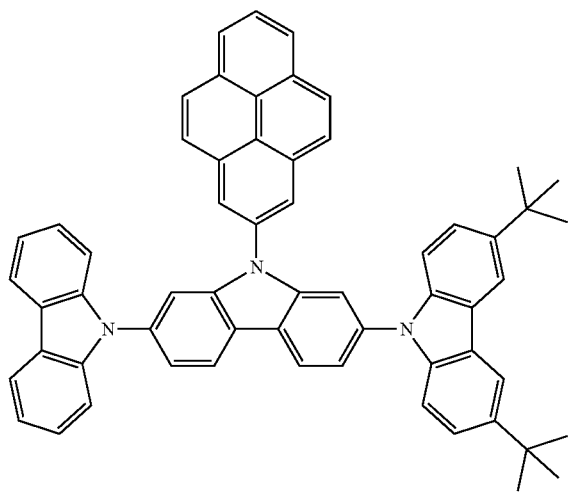
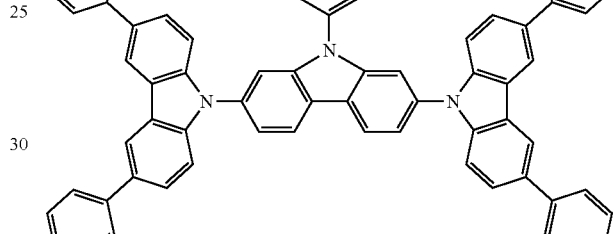
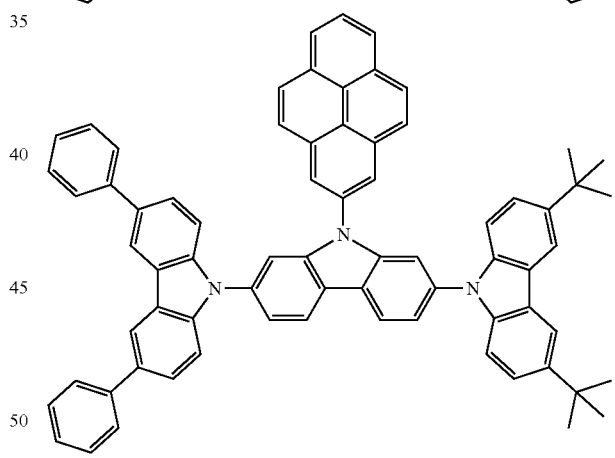
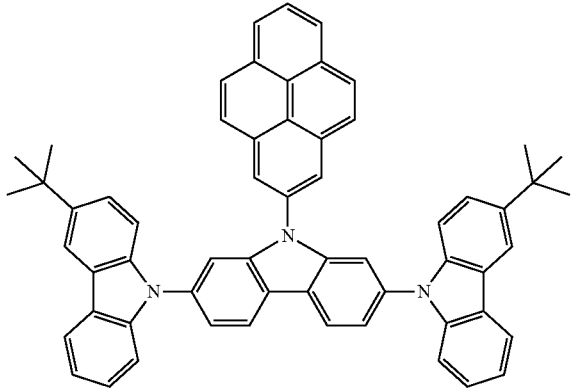
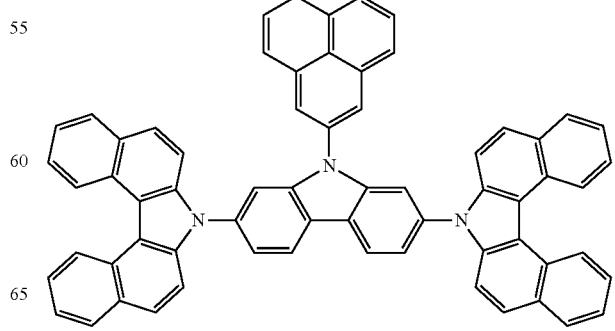

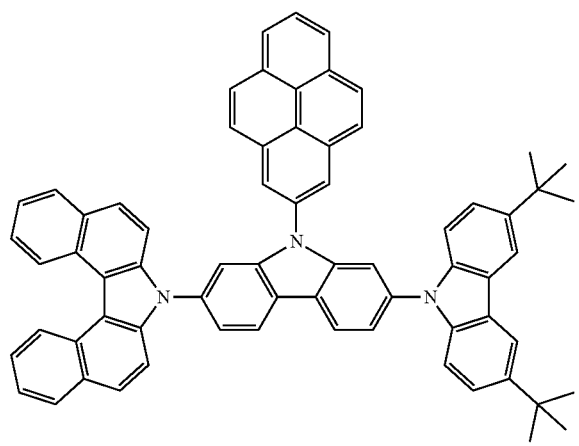
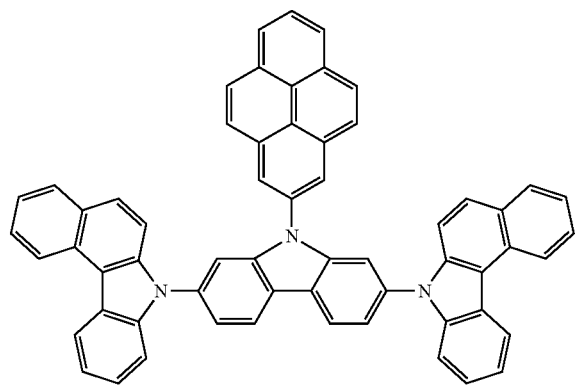
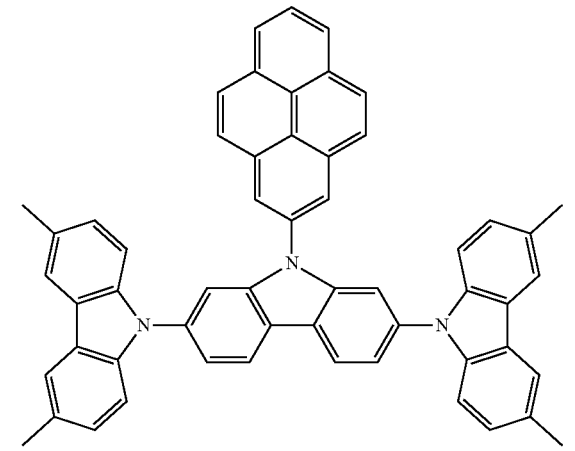
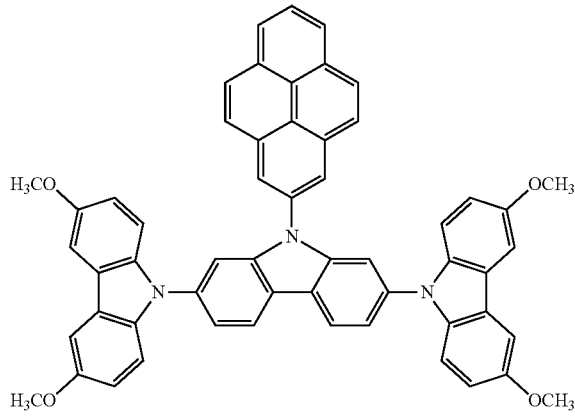

13
-continued
14
-continued
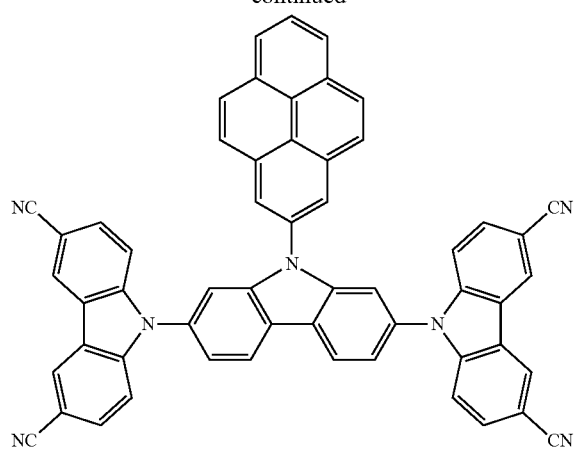
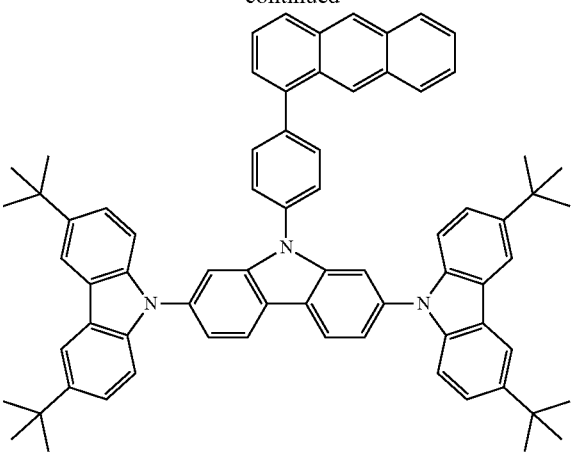
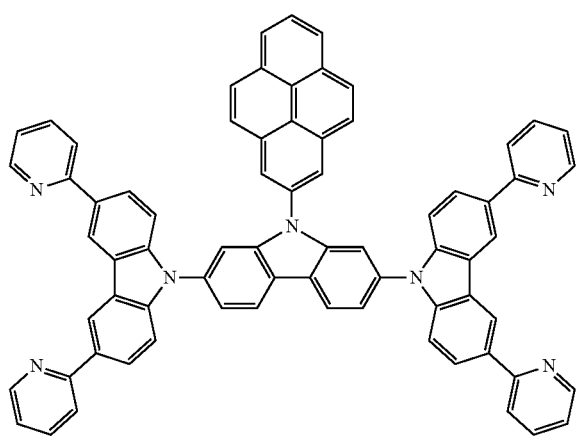
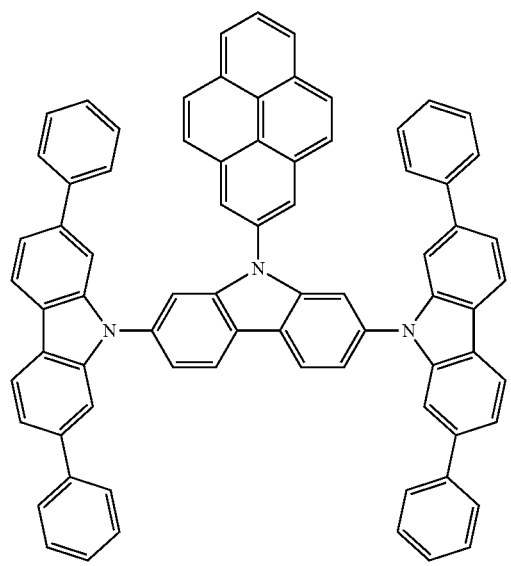
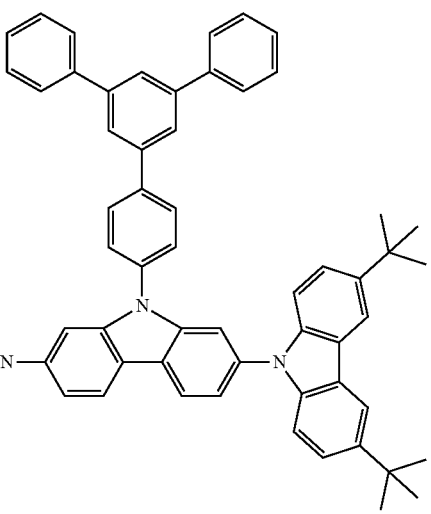

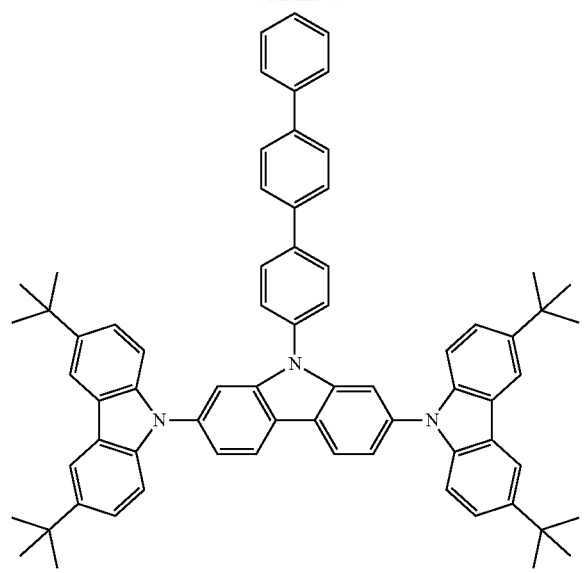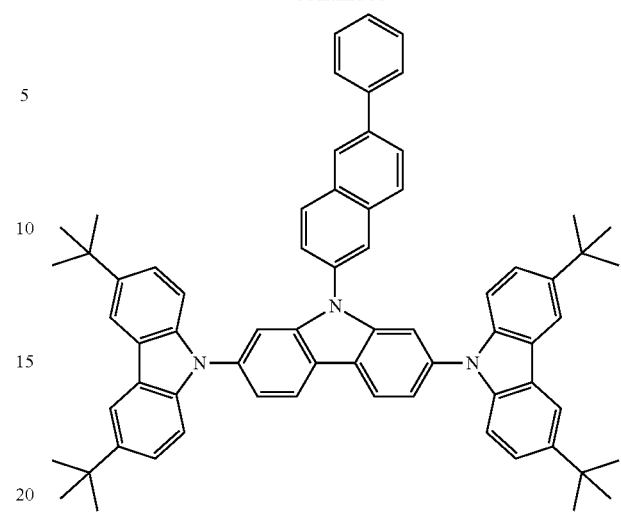

17
-continued
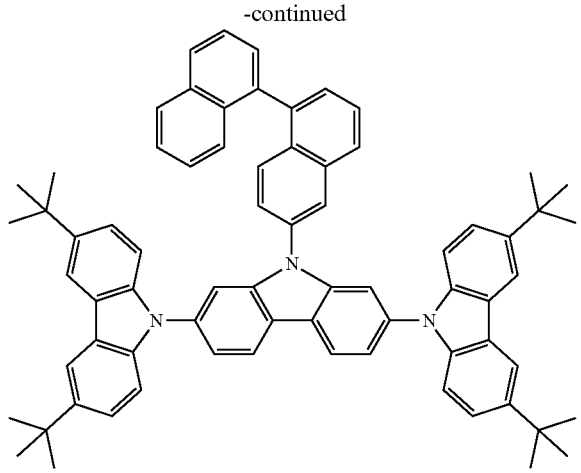
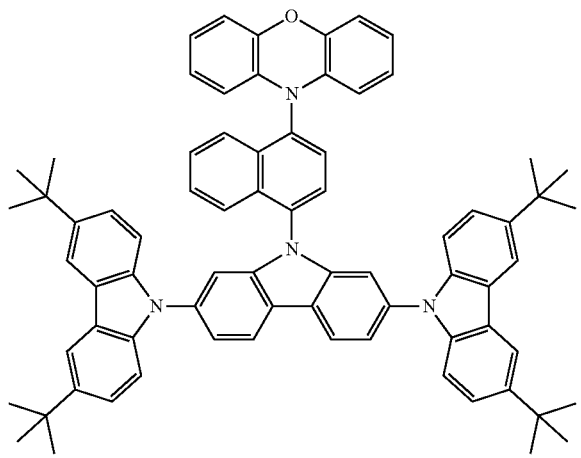
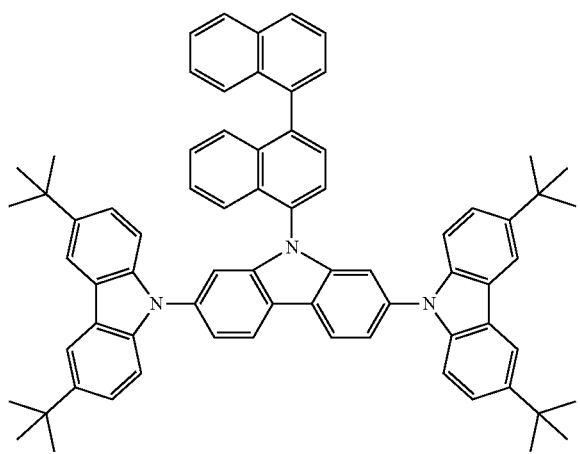
18
-continued
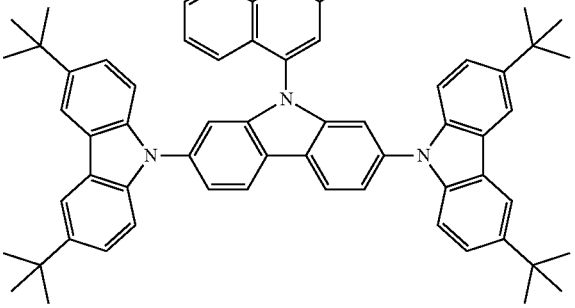
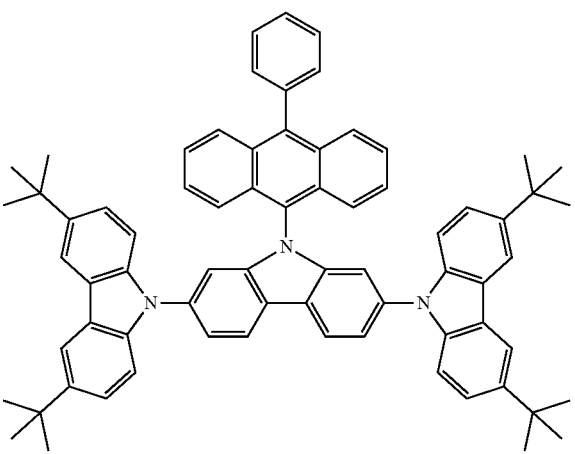
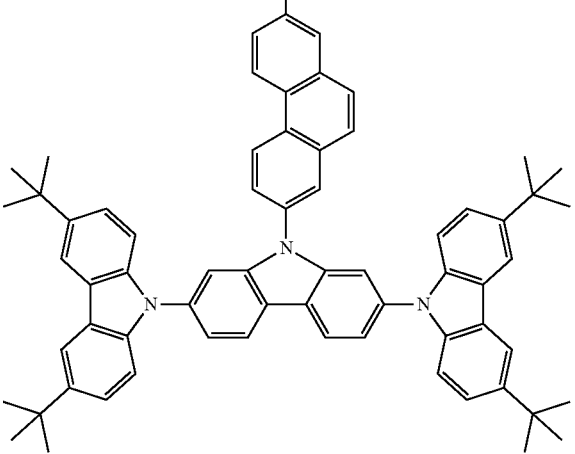

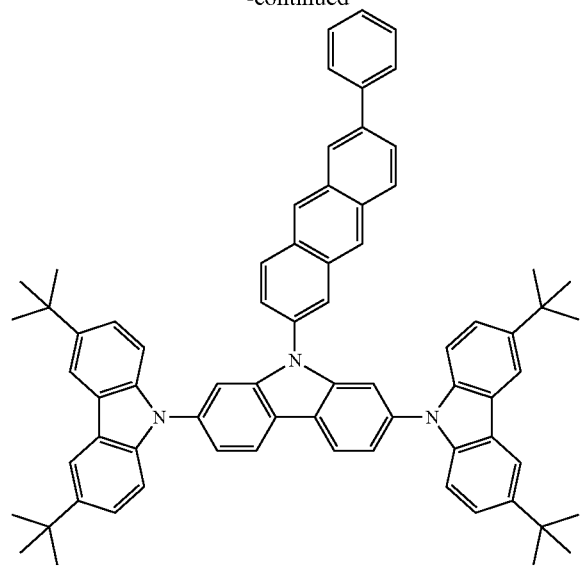
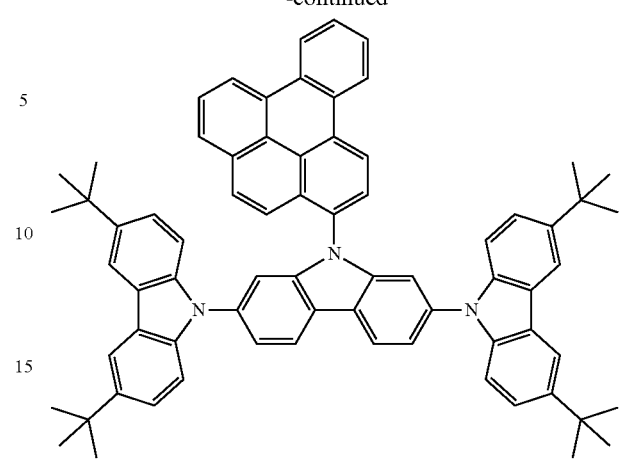
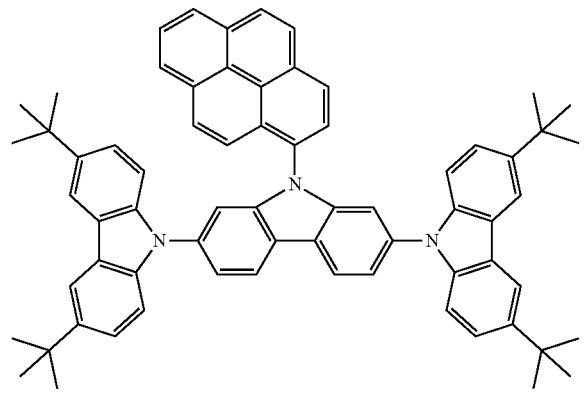
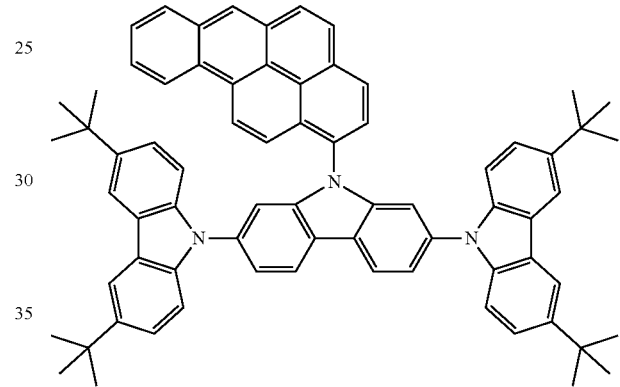
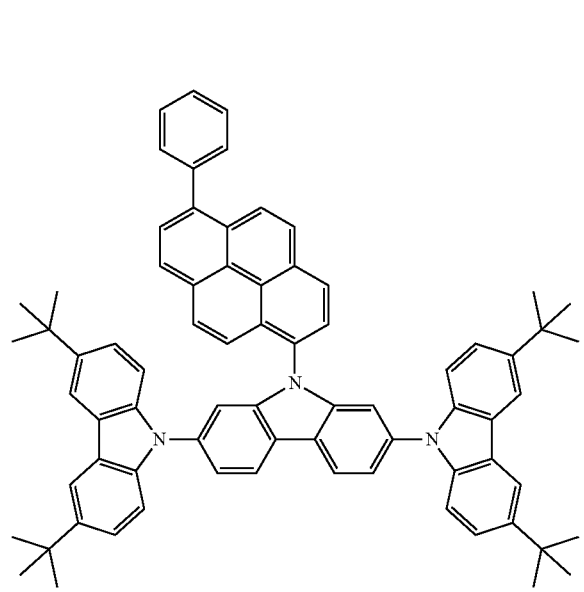
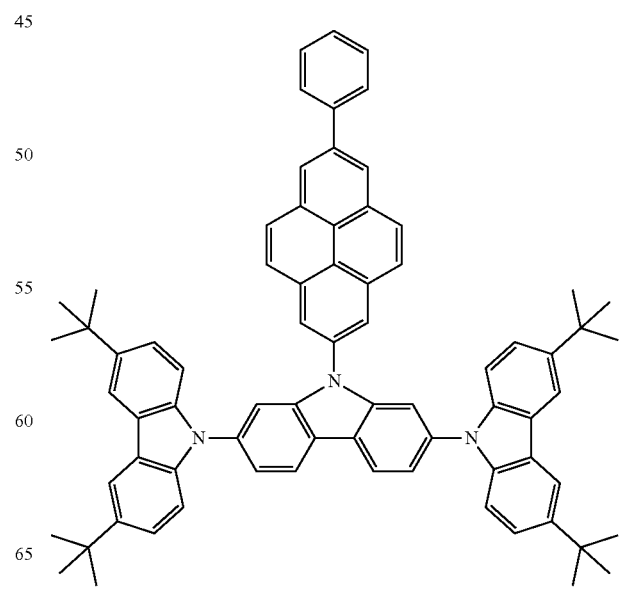

21
-continued
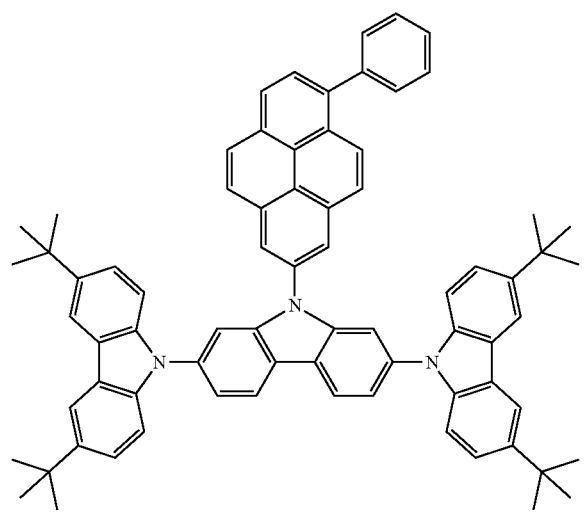
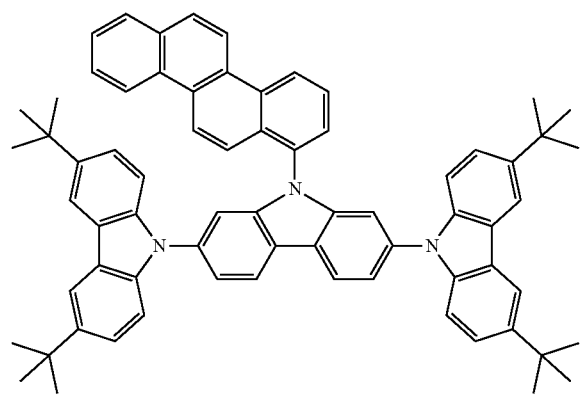
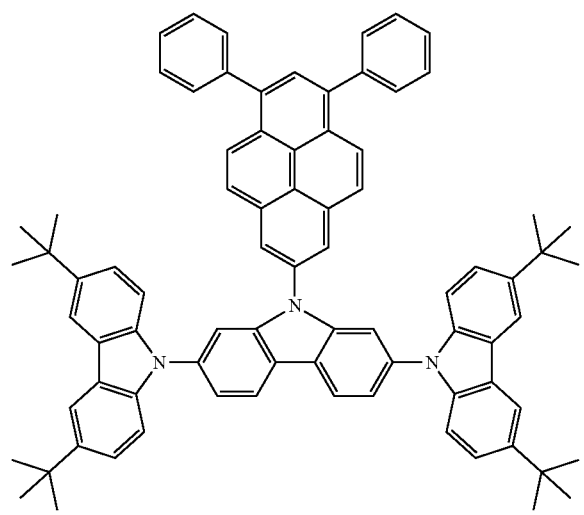
22
-continued
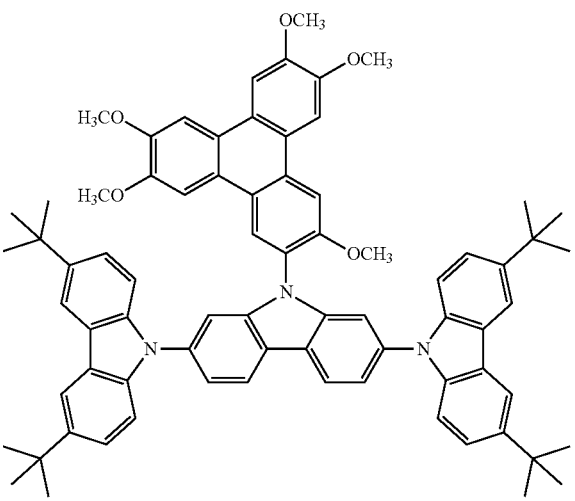
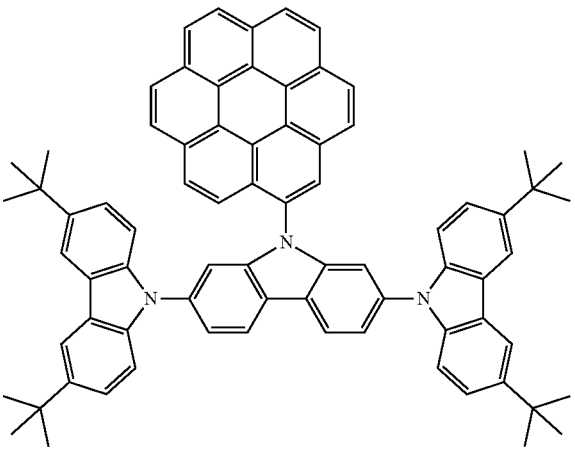
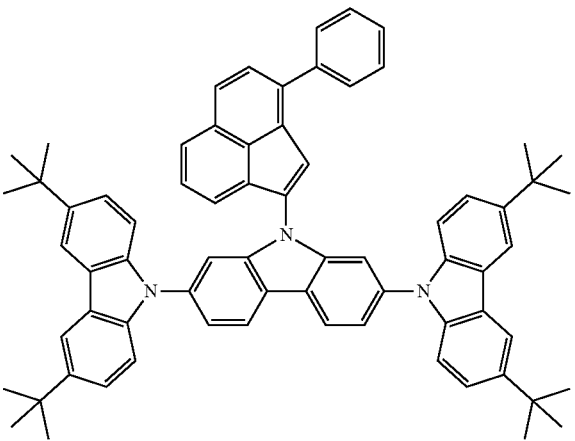

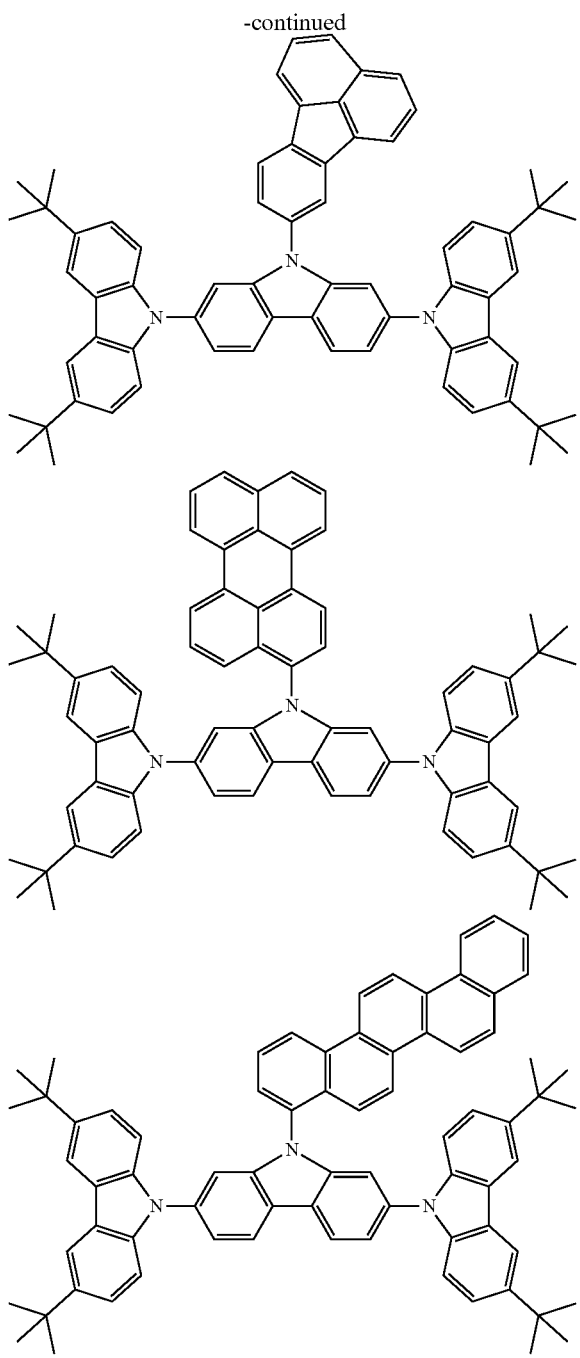

<Producing Method>

A method for producing the electron blocking layer is not particularly limited, and the electron blocking layer can be formed by a dry film formation method or a wet film formation method. As the dry film formation method, it is possible to use a vapor deposition method, a sputtering method, and the like. The vapor deposition may be physical vapor deposition (PVD) or chemical vapor deposition (CVD), but among these, physical vapor deposition such as vacuum vapor deposition is preferable. As the wet film formation method, it is possible to use an inkjet method, a spraying method, a nozzle printing method, a spin coating method, a dip coating method, a casting method, a die coating method, a roll coating method, a bar coating method, a gravuer coating method, and the like. Among these, from the viewpoint of high-accuracy patterning, an inkjet method is preferable.

From the viewpoint of photoelectric conversion efficiency, the content of the specific compound in the electron blocking layer is, with respect to the total mass of compounds forming the electron blocking layer, preferably equal to or greater than 10% by mass and equal to or less than 100% by mass, more preferably equal to or greater than 20% by mass and equal to or less than 100% by mass, and even more preferably equal to or greater than 30% by mass and equal to or less than 100% by mass.

The thickness of the electron blocking layer is preferably 10 nm to 300 nm, more preferably 30 nm to 150 nm, and particularly preferably 50 nm to 100 nm, in terms of a single layer.

The electron blocking layer may be configured with plural layers.

As the electron blocking layer, inorganic materials can also be used. Generally, inorganic materials have a higher dielectric constant compared to organic materials. Accordingly, when inorganic materials are used for the electron blocking layer, higher voltage is applied to the photoelectric conversion film, hence the photoelectric conversion efficiency can be improved. Examples of materials that can form the electron blocking layer include calcium oxide, chromium oxide, copper-chromium oxide, manganese oxide, cobalt oxide, nickel oxide, copper oxide, copper-gallium oxide, copper-strontium oxide, niobium oxide, molybdenum oxide, copper-indium oxide, silver-indium oxide, iridium oxide, and the like.

The electron blocking layer containing the specific compound also functions as a hole transporting layer.

As a preferred embodiment of the photoelectric conversion element of the present invention, an embodiment is exemplified in which the photoelectric conversion element has a transparent conductive film, a photoelectric conversion film, a first electron blocking layer functioning as a hole transporting layer, a second electron blocking layer functioning as an electron blocking layer, and a conductive film in this order, and the first electron blocking layer functioning as the hole transporting layer contains the specific compound. The second electron blocking layer functioning as the electron blocking layer may or may not contain the specific compound.

[Photoelectric Conversion Film]

The photoelectric conversion film is a layer disposed between the transparent conductive film and the conductive film, which will be described later, together with the electron blocking layer described above.

It is preferable that an organic material constituting the photoelectric conversion film contain at least either a p-type organic semiconductor or an n-type organic semiconductor. The effects of the present invention are particularly markedly exhibited in a case where the photoelectric conversion film contains a material having an electron affinity (Ea) of equal to or greater than 4.0 eV. Examples of the material having an electron affinity (Ea) of equal to or greater than 4.0 eV include an n-type organic semiconductor which will be described later.

<p-Type Compound>

The p-type organic semiconductor (p-type compound) is a donor-type organic semiconductor. This material is mainly represented by a hole-transporting organic compound and refers to an organic compound that easily donates electrons. More specifically, when two organic materials are used by being brought into contact to each other, an organic compound having a smaller ionization potential is called the p-type organic semiconductor. Accordingly, as the donor-type organic compound, any organic compounds can be used as long as they have electron-donating properties. For example, it is possible to use metal complexes and the like having a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a condensed aromatic carbon ring compound (a naphthalene derivative, an anthracene derivative, a phenanthrene derivative, a tetracene derivative, a pyrene derivative, a perylene derivative, or a fluoranthene derivative), or a nitrogen-containing heterocyclic compound as a ligand. The donor-type organic semiconductor is not limited to the above, and any of organic compounds may be used as the donor-type organic semiconductor, as long as their ionization potential is smaller than the ionization potential of the organic compound used as the n-type (acceptor-type) compound as described above.

Among these, a triarylamine compound is preferable.

As the p-type compound, a compound represented by the following Formula (W) is preferable.

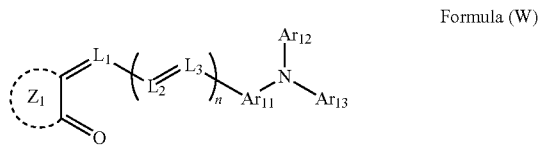

Formula (W)

In Formula (W), $Z_1$ is a ring containing at least two carbon atoms and represents a 5-membered ring, a 6-membered ring, or a condensed ring containing at least any of a 5-membered ring and a 6-membered ring. $Z_1$ may have a substituent.

Each of $L_1$, $L_2$, and $L_3$ independently represents a methine group which may have a substituent.

n represents an integer of equal to or greater than 0.

$Ar_{11}$ represents an arylene group or a heteroarylene group which may have a substituent.

$Ar_{11}$ and $L_1$ may form a ring by being bonded to each other, and the ring formed by $Ar_{11}$ and $L_1$ bonded to each other may have a substituent.

Each of $Ar_{12}$ and $Ar_{13}$ independently represents an aryl group or a heteroaryl group which may have a substituent. $Ar_{11}$ and $Ar_{12}$, $Ar_{11}$ and $Ar_{13}$, or $Ar_{12}$ and $Ar_{13}$ may form a ring by being bonded to each other.

In Formula (W), $Z_1$ is a ring containing at least two carbon atoms and represents a 5-membered ring, a 6-membered ring, or a condensed ring containing at least any of a 5-membered ring and a 6-membered ring.

As such a ring, rings which are usually used as an acidic nucleus in merocyanine dyes are preferable, and specific examples thereof include the following.

(a) 1,3-Dicarbonyl nuclei: for example, a 1,3-indandione nucleus, 1,3-cyclohexanedione, 5,5-dimethyl-1,3-cyclohexanedione, and 1,3-dioxane-4,6-dione.

(b) Pyrazolinone nuclei: for example, 1-phenyl-2-pyrazolin-5-one, 3-methyl-1-phenyl-2-pyrazolin-5-one, and 1-(2-benzothiazolyl)-3-methyl-2-pyrazolin-5-one.

(c) Isoxazolinone nuceli: for example, 3-phenyl-2-isoxazolin-5-one, and 3-methyl-2-isoxazolin-5-one.

(d) Oxindole nuclei: for example, 1-alkyl-2,3-dihydro-2-oxindole.

(e) 2,4,6-Trioxohexahydropyrimidine nuclei: for example, barbituric acid or 2-thiobarbituric acid and derivatives thereof; Examples of the derivatives include 1-alkyl compounds such as 1-methyl and 1-ethyl, 1,3-dialkyl compounds such as 1,3-dimethyl, 1,3-diethyl, and 1,3-dibutyl, 1,3-diaryl compounds such as 1,3-diphenyl, 1,3-di(p-chlorophenyl), and 1,3-di(p-ethoxycarbonylphenyl), 1-alkyl-3-aryl compounds such as 1-ethyl-3-phenyl, 1,3-diheteroaryl compounds such as 1,3-di(2-pyridyl), and the like.

(f) 2-Thio-2,4-thiazolidinedione nuclei: for example, rhodanine and derivatives thereof; Examples of the derivatives include 3-alkylrhodanine such as 3-methylrhodanine, 3-ethylrhodanine, and 3-allylrhodanine, 3-arylrhodanine such as 3-phenylrhodanine, 3-heteroarylrhodanine such as 3-(2-pyridyl)rhodanine, and the like.

(g) 2-Thio-2,4-oxazolidinedione (2-thio-2,4-(3H,5H)-oxazoledione) nuclei: for example, 3-ethyl-2-thio-2,4-oxazolidinedione.

(h) Thianaphthenone nuclei: for example, 3(2H)-thianaphthenone-1,1-dioxide.

(i) 2-Thio-2,5-thiazolidinedione nuclei: for example, 3-ethyl-2-thio-2,5-thiazolidinedione.

(j) 2,4-Thiazolidinedione nuclei: for example, 2,4-thiazolidinedione, 3-ethyl-2,4-thiazolidinedione, and 3-phenyl-2,4-thiazolidinedione.

(k) Thiazolin-4-one nuclei: for example, 4-thiazolinone and 2-ethyl-4-thiazolinone.

(l) 2,4-Imidazolidinedione (hydantoin) nuclei: for example, 2,4-imidazolidinedione and 3-ethyl-2,4-imidazolidinedione.

(m) 2-Thio-2,4-imidazolidinedione (2-thiohydantoin) nuclei: for example, 2-thio-2,4-imidazolidinedione and 3-ethyl-2-thio-2,4-imidazolidinedione.

(n) Imidazolin-5-one nuclei: for example, 2-propylmercapto-2-imidazolin-5-one.

(o) 3,5-Pyrazolidinedione nuclei: for example, 1,2-diphenyl-3,5-pyrazolidinedione and 1,2-dimethyl-3,5-pyrazolidinedione.

(p) Benzothiophen-3(2H)-one nuclei: for example, benzothiophen-3(2H)-one, oxobenzothiophen-3(2H)-one, and dioxobenzothiophen-3(2H)-one.

(q) Indanone nuclei: for example, 1-indanone, 3-phenyl-1-indanone, 3-methyl-1-indanone, 3,3-diphenyl-1-indanone, and 3,3-dimethyl-1-indanone.

(r) Benzofuran-3-(2H)-one nucleus: for example, benzofuran-3-(2H)-one.

(s) 2,2-Dihydrophenalene-1,3-dione nucleus or the like.

$Z_1$ is preferably a group represented by the following Formula (Z1) because the responsiveness and sensitivity are further improved.

Formula (Z1)

In Formula (Z1), $Z_2$ is a ring that contains at least three carbon atoms and represents a 5-membered ring, a 6-membered ring, or a condensed ring containing at least any of a 5-membered ring and a 6-membered ring.

In Formula (Z1), * represents a binding position where the ring is bonded to $L_1$ described above.

In Formula (W), each of $L_1$, $L_2$, and $L_3$ independently represents a methine group which may have a substituent.

Examples of the substituent include a substituent W which will be described later, and the like.

n represents an integer of equal to or greater than 0. n is preferably 0 to 3, and more preferably 0.

In Formula (W), $Ar_{11}$ represents an arylene group or a heteroarylene group which may have a substituent. Examples of the substituent include a substituent W which will be described later, and the like.

$Ar_{11}$ is preferably an arylene group which may have a substituent.

In a case where $Ar_{11}$ is an arylene group, $Ar_{11}$ is preferably an arylene group having 6 to 30 carbon atoms, and more preferably an arylene group having 6 to 20 carbon atoms. Specific examples of rings constituting the arylene group include a benzene ring, a naphthalene ring, an anthracene ring, a phenanthrene ring, a fluorene ring, a triphenylene ring, a naphthacene ring, a biphenyl ring (two phenyl groups may be linked to each other in any fashion of linking), a terphenyl ring (three benzene rings may be linked to each other in any fashion of linking), and the like.

In a case where $Ar_{11}$ is a heteroarylene group, $Ar_{11}$ is preferably a heteroarylene group composed of a 5-, 6-, or 7-membered ring or a condensed ring thereof. Examples of heteroatoms contained in the heteroarylene group include an oxygen atom, a sulfur atom, a nitrogen atom, and the like. Specific examples of rings constituting the heteroarylene group include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyran ring, a thiin ring, a pyridine ring, a piperidine ring, an oxazine ring, a morpholine ring, a thiazine ring, a pyridazine ring, a pyrimidine ring, a pyrazine ring, a piperazine ring, a triazine ring, a benzofuran ring, an isobenzofuran ring, a benzothiophene ring, an indole ring, an indoline ring, an isoindole ring, a benzoxazole ring, a benzothiazole ring, an indazole ring, a benzimidazole ring, a quinoline ring, an isoquinoline ring, a cinnoline ring, a phthalazine ring, a quinazoline ring, a quinoxaline ring, a dibenzofuran ring, a dibenzothiophene ring, a carbazole ring, a xanthene ring, an acridine ring, a phenanthridine ring, a phenanthroline ring, a phenazine ring, a phenoxazine ring, a thianthrene ring, an indolizine ring, a quinolizine ring, a quinuclidine ring, a naphthyridine ring, a purine ring, a pteridine ring, and the like.

$Ar_{11}$ and $L_1$ may form a ring by being bonded to each other. Examples of the formed ring include a ring R which will be described later, and the like. The ring formed by $Ar_{11}$ and $L_1$ bonded to each other may have a substituent. Examples of the substituent include a substituent W which will be described later, and the like.

In Formula (W), each of $Ar_{12}$ and $Ar_{13}$ independently represents an aryl group or a heteroaryl group which may have a substituent. Examples of the substituent include a substituent W which will be described later, and the like.

In a case where $Ar_{12}$ or $Ar_{13}$ is an aryl group, an aryl group having 6 to 30 carbon atoms is preferable, and an aryl group having 6 to 20 carbon atoms is more preferable. Specific examples of rings constituting the aryl group are the same as the specific examples of rings constituting the arylene group in the aforementioned case where $Ar_{11}$ is an arylene group.

In a case where $Ar_{12}$ or $Ar_{13}$ is a heteroaryl group, $Ar_{12}$ or $Ar_{13}$ is preferably a heteroaryl group composed of a 5-, 6-, or 7-membered ring or a condensed ring thereof. Specific examples of heteroatoms contained in the heteroaryl group are the same as the specific examples of heteroatoms contained in the heteroarylene group in the aforementioned case where $Ar_{11}$ is a heteroarylene group. Specific examples of rings constituting the heteroaryl group are the same as the specific examples of rings constituting the heteroarylene group in the aforementioned case where $Ar_{11}$ is a heteroarylene group.

$Ar_{11}$ and $Ar_{12}$, $Ar_{11}$ and $Ar_{13}$, or $Ar_{12}$ and $Ar_{13}$ may form a ring by being bonded to each other. Examples of the formed ring include a ring R which will be described later, and the like.

It is preferable that at least one of $Ar_{11}$ and $Ar_{12}$ and $Ar_{11}$ and $Ar_{13}$ form a ring by being bonded to each other. Examples of the formed ring include a ring R which will be described later, and the like.

As a preferred embodiment of the compound represented by Formula (W), a compound represented by the following Formula (W1) is exemplified.

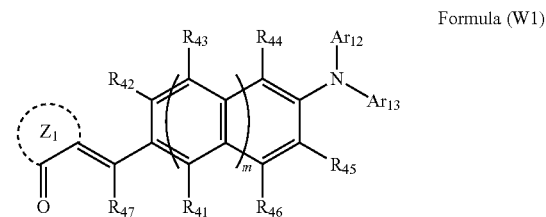

Formula (W1)

In Formula (W1), the definition, specific examples, and preferred embodiments of $Z_1$ are the same as in Formula (W) described above.

In Formula (W1), each of $R_{41}$ to $R_{47}$ independently represents a hydrogen atom or a substituent. Examples of the substituent include a substituent W which will be described later, and the like. $R_{42}$ and $R_{43}$, $R_{43}$ and $R_{44}$, $R_{45}$ and $R_{46}$, and $R_{41}$ and $R_{46}$ may form a ring by being bonded to each other. Examples of the formed ring include a ring R which will be described later, and the like.

In Formula (W1), m represents 0 or 1. m is particularly preferably 1.

In Formula (W1), the definition, specific examples, and preferred embodiments of $Ar_{12}$ and $Ar_{13}$ are the same as in Formula (W) described above.

At least either $Ar_{12}$ or $Ar_{13}$ forms a ring by being bonded to any of $R_{41}$ to $R_{46}$ through a single bond or Xa which is a divalent group. In a case where $Ar_{12}$ or $Ar_{13}$ forms a ring, each of $R_{41}$ to $R_{46}$ may be an atomic bonding.

Herein, Xa represents an oxygen atom (—O—), a sulfur atom (—S—), an alkylene group, a silylene group (—$SiR_aR_b$—: each of $R_a$ and $R_b$ independently represents a hydrogen atom or a substituent (for example, a substituent W which will be described later)), —$NR_a$— ($R_a$ represents a hydrogen atom or a substituent (for example, a substituent W which will be described later)), an alkenylene group, a cycloalkylene group, a cycloalkenylene group, an arylene group, a heteroarylene group, or a group obtained by combining these. Xa may have a substituent (for example, a substituent W which will be described later).

As the most preferred embodiment of the compound represented by Formula (W), a compound represented by the following Formula (W2) is exemplified.

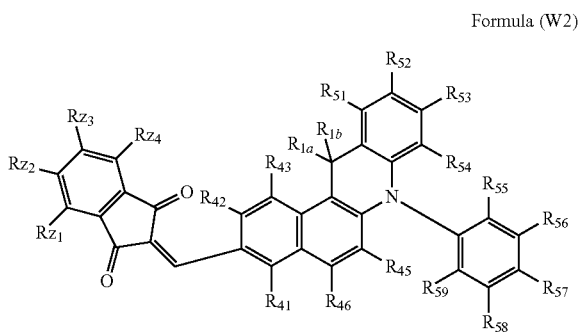

Formula (W2)

In Formula (W2), each of $Rz_1$ to $Rz_4$ independently represents a hydrogen atom or a substituent. Examples of the substituent include a substituent W which will be described later, and the like. $Rz_1$ and $Rz_2$, $Rz_2$ and $Rz_3$, and $Rz_3$ and $Rz_4$ may form a ring by being bonded to each other. Examples of the formed ring include a ring R which will be described later, and the like.

In Formula (W2), each of $R_{41}$, $R_{42}$, $R_{43}$, $R_{45}$, and $R_{46}$ independently represents a hydrogen atom or a substituent. Examples of the substituent include a substituent W which will be described later, and the like. $R_{42}$ and $R_{43}$, $R_{45}$ and $R_{46}$, and $R_{41}$ and $R_{46}$ may form a ring by being bonded to each other. Examples of the formed ring include a ring R which will be described later, and the like.

In Formula (W2), each of $R_{1a}$ and $R_{1b}$ independently represents a hydrogen atom or a substituent. Examples of the substituent include a substituent W which will be described later, and the like. Among these, an alkyl group (particularly, an alkyl group having 1 to 20 carbon atoms) is preferable, and an alkyl group having 1 to 3 carbon atoms is more preferable. $R_{1a}$ and $R_{1b}$ may form a ring by being bonded to each other. Examples of the formed ring include a ring R which will be described later, and the like.

In Formula (W2), each of $R_{51}$ to $R_{54}$ independently represents a hydrogen atom or a substituent. Examples of the substituent include a substituent W which will be described later, and the like. $R_{51}$ and $R_{52}$, $R_{52}$ and $R_{53}$, and $R_{53}$ and $R_{54}$ may form a ring by being bonded to each other. Examples of the formed ring include a ring R which will be described later, and the like.

In Formula (W2), each of $R_{55}$ to $R_{59}$ independently represents a hydrogen atom or a substituent. Examples of the substituent include a substituent W which will be described later, and the like. $R_{55}$ and $R_{56}$, $R_{56}$ and $R_{57}$, $R_{57}$ and $R_{58}$, and $R_{58}$ and $R_{59}$ may form a ring by being bonded to each other. Examples of the formed ring include a ring R which will be described later, and the like.

(Substituent W)

The substituent W in the present specification will be described.

Examples of the substituent W include a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbornyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, an ureide group, a boronic acid group (—B(OH)$_2$), a phosphate group (—OPO(OH)$_2$), a sulfate group (—OSO$_3$H), and other known substituents.

The details of the substituents are described in paragraph [0023] of JP 2007-234651 A.

(Ring R)

The ring R in the present specification will be described.

Examples of the ring R include aromatic hydrocarbon rings, aromatic heterocycles, non-aromatic hydrocarbon rings, non-aromatic heterocycles, and polycyclic condensed rings which are formed when the above rings are combined with each other. More specifically, examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolidine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, a phenazine ring, a cyclopentane ring, a cyclohexane ring, a pyrrolidine ring, a piperidine ring, a tetrahydrofuran ring, a tetrahydropyran ring, a tetrahydrothiophene ring, a tetrahydrothiopyran ring, and the like.

The ring R may have the aforementioned substituent W.

The compound represented by the aforementioned Formula (W) can be manufactured according to the known methods by modifying a part thereof. Specific examples of the compound represented by the aforementioned Formula (W) include compounds described in JP 2012-77064 A and JP 2013-214730 A, and compounds described below, but the present invention is not limited thereto. Herein, in the specific examples described below, Me represents methyl and TMS represents trimethylsilyl.

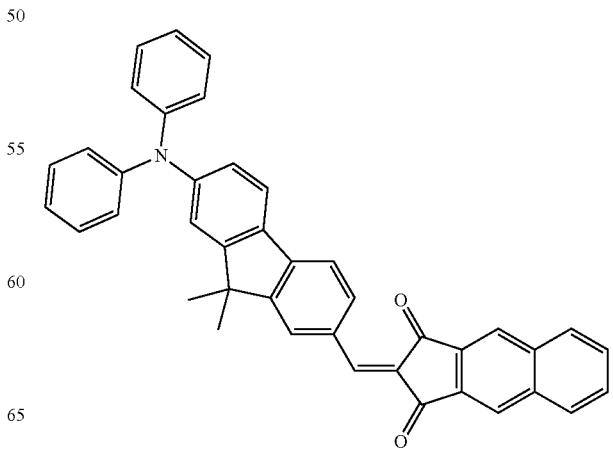

31
-continued
32
-continued
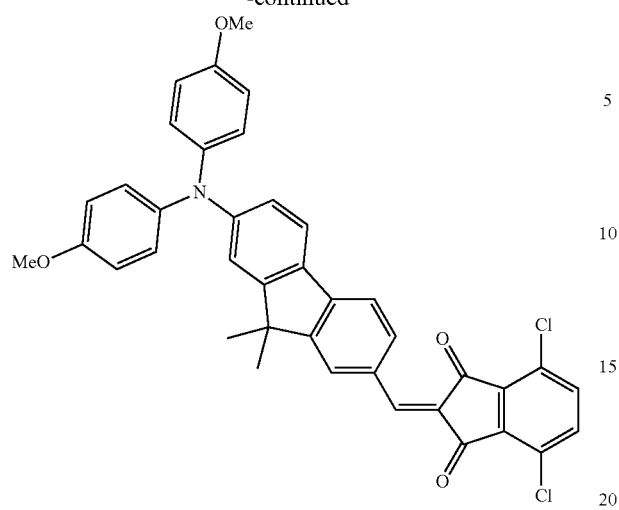
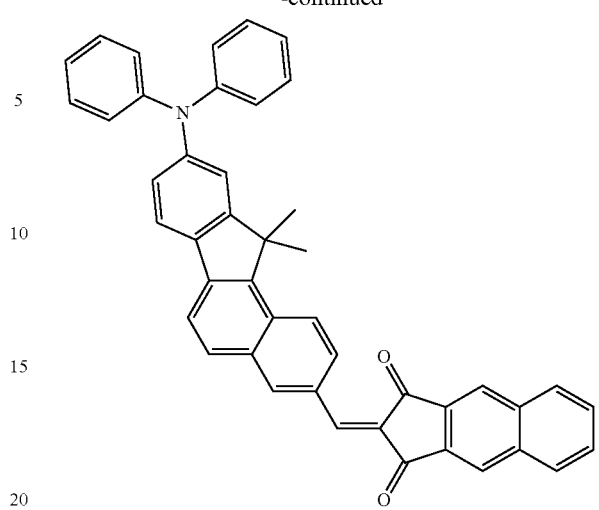
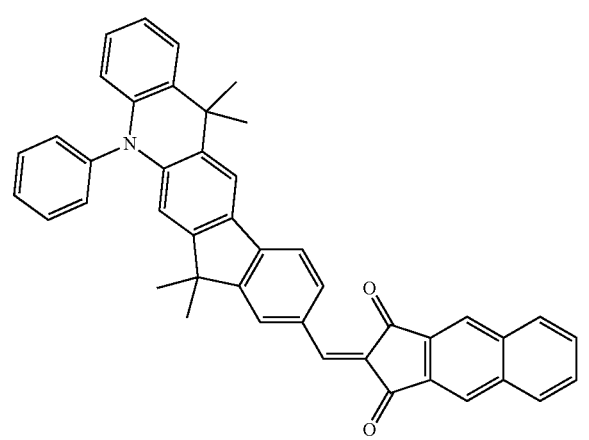
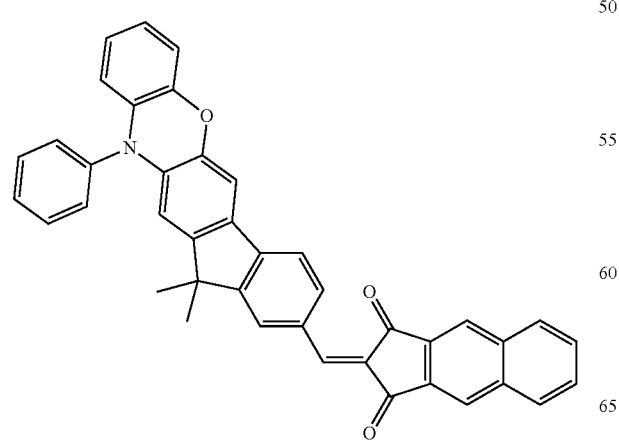
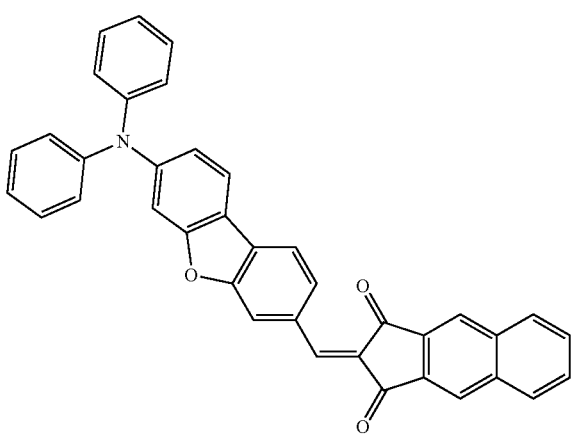

33
-continued
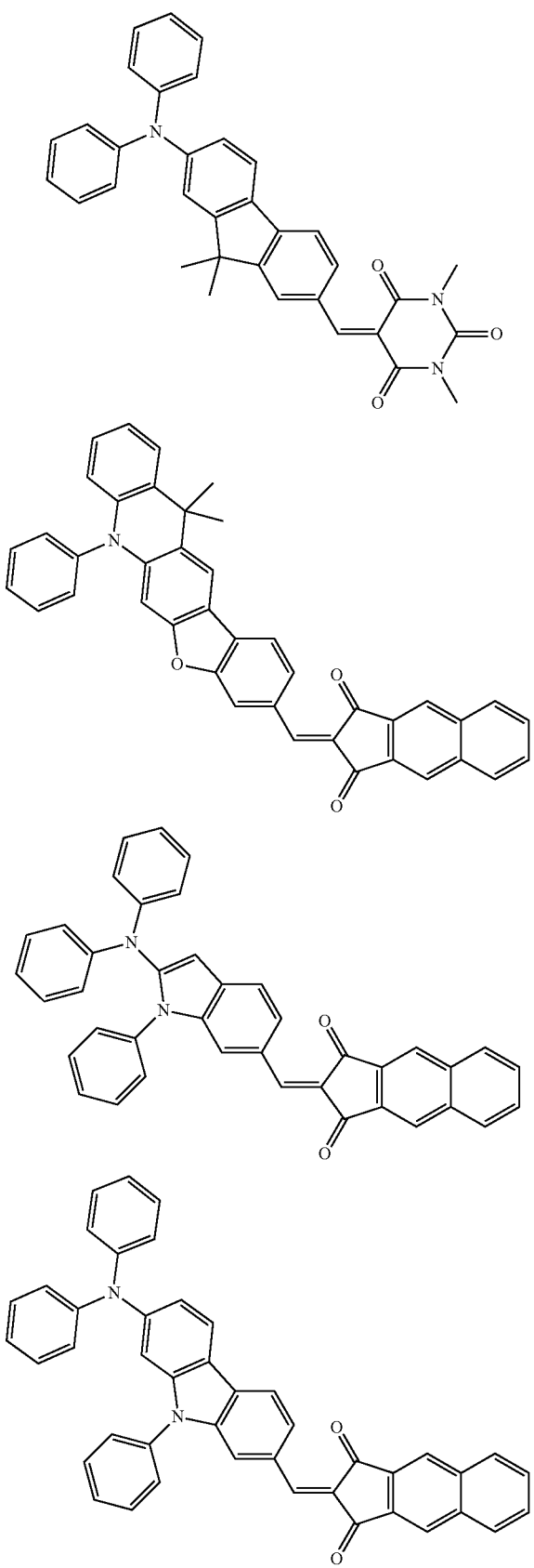
34
-continued
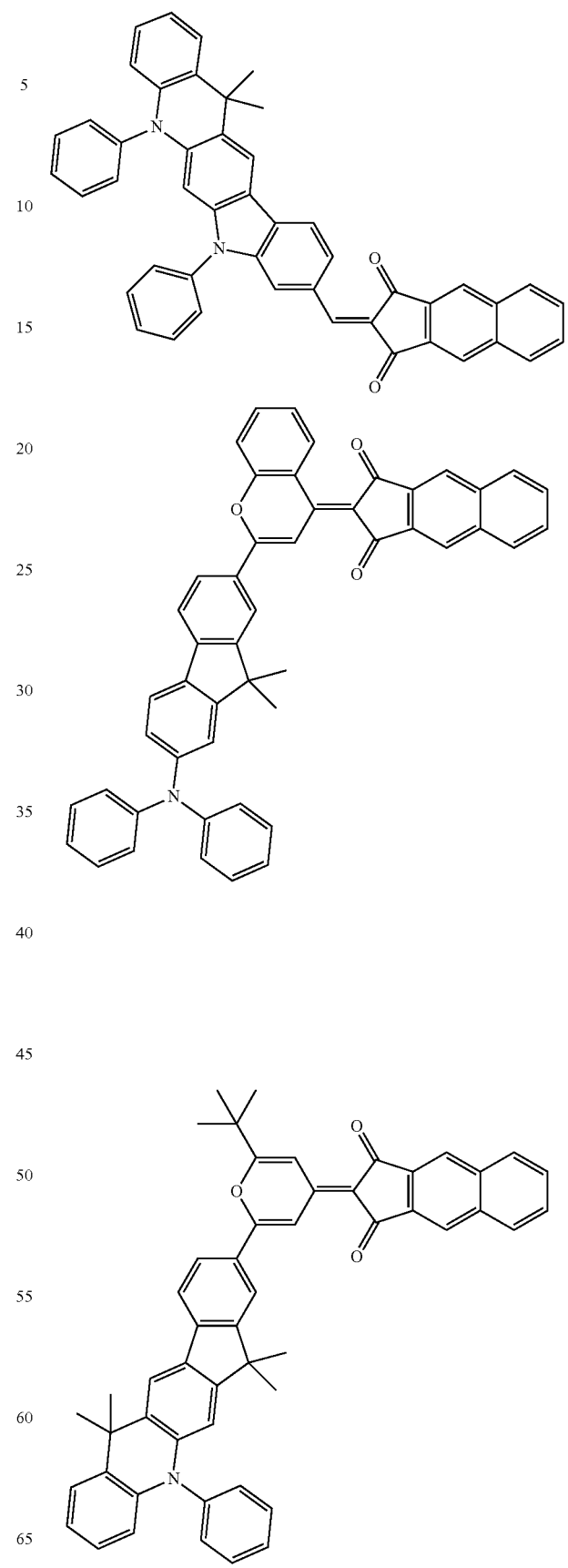

35
-continued
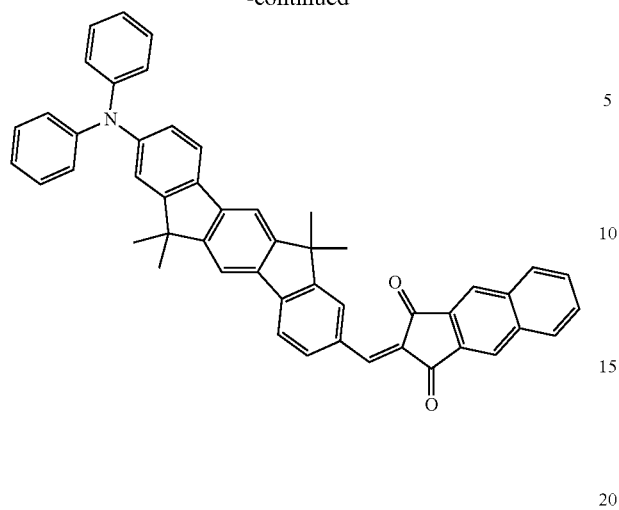
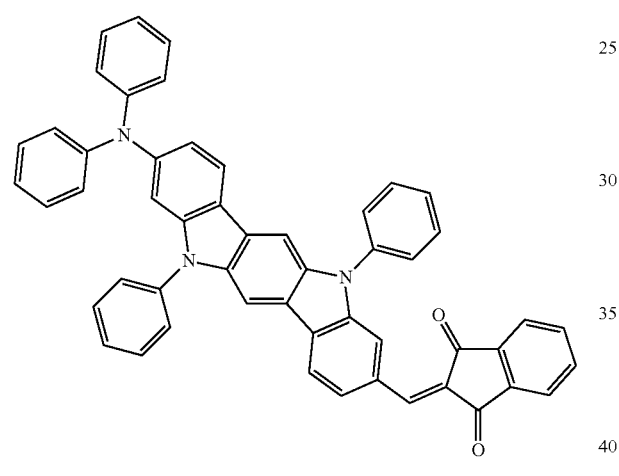
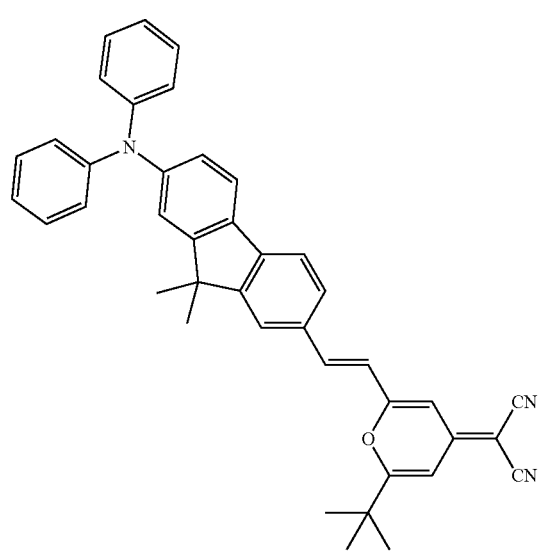
36
-continued
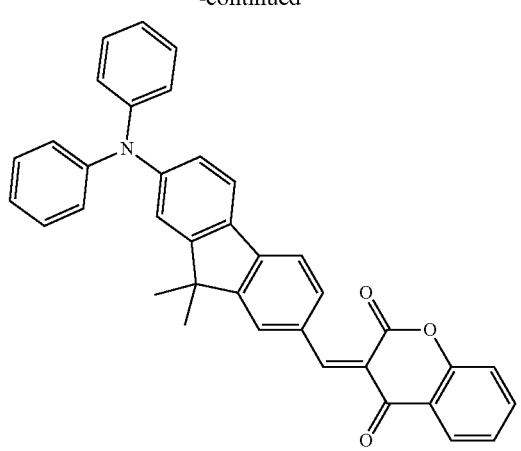
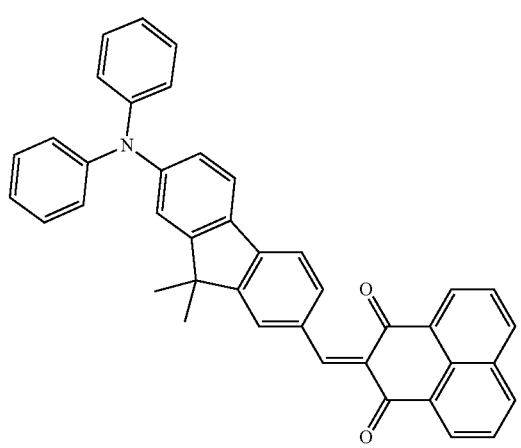
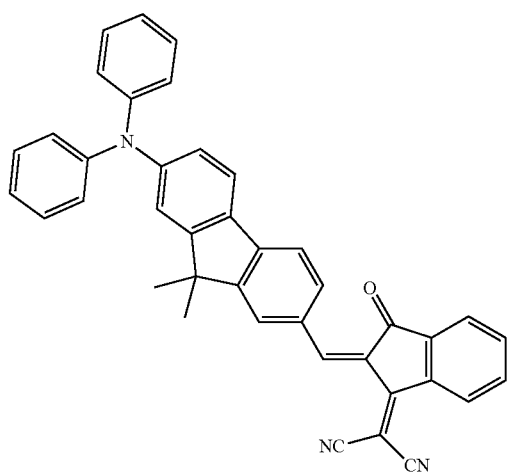

37
-continued
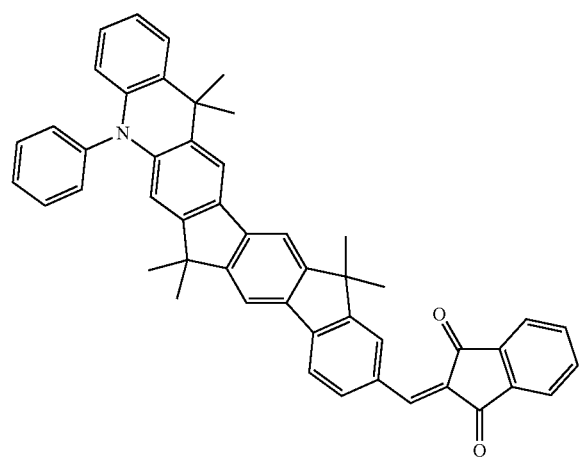
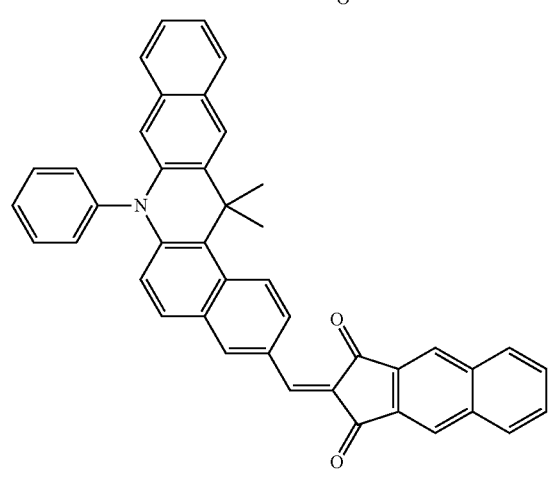
38
-continued
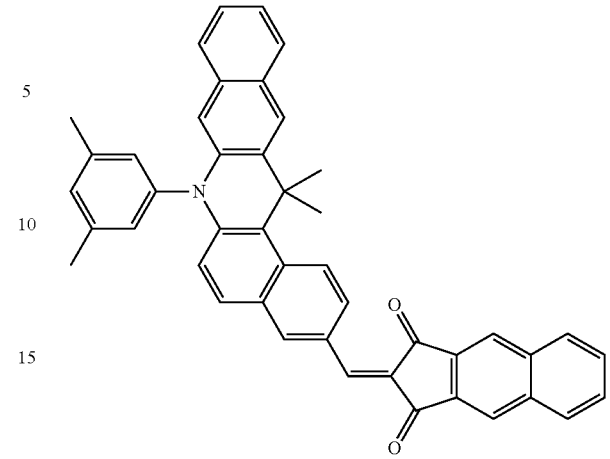
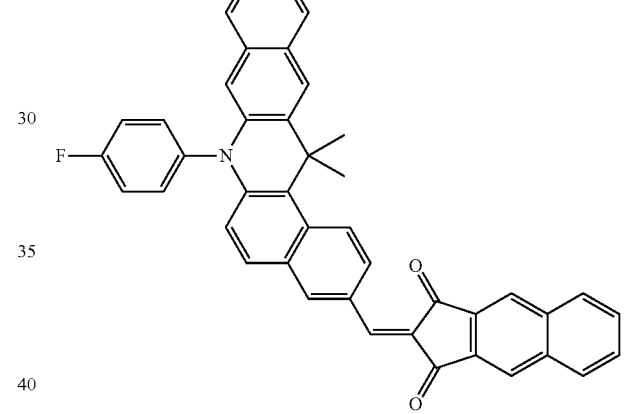
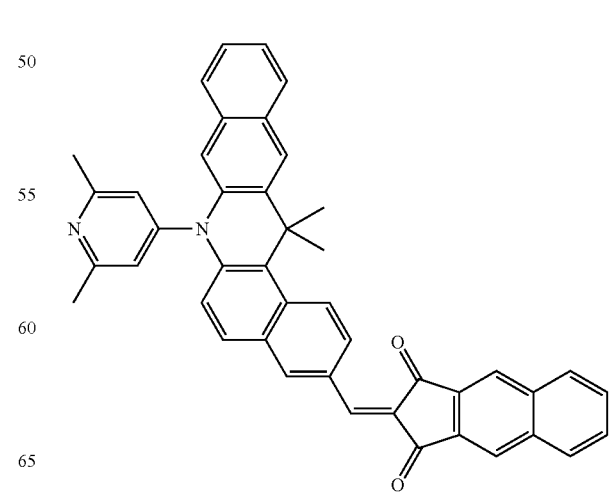

39
-continued
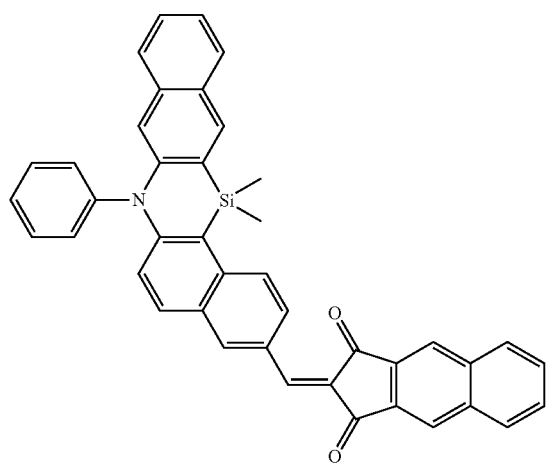
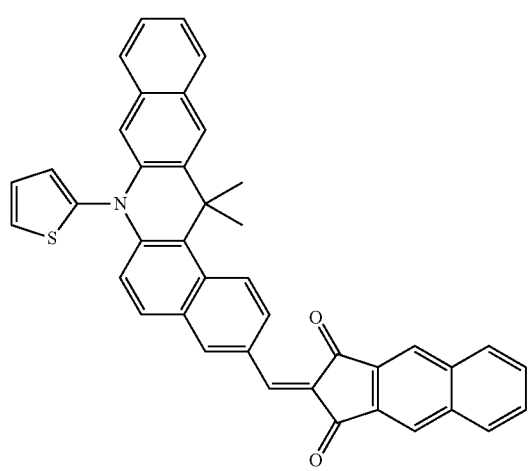
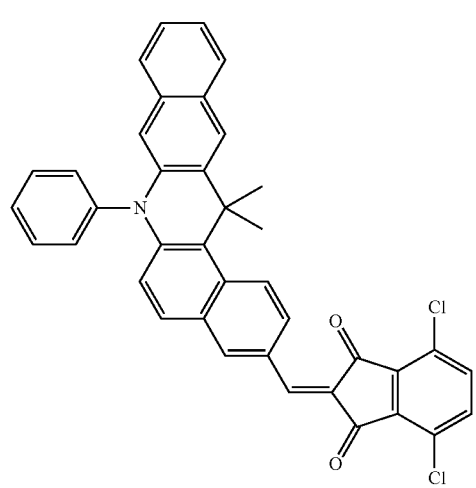
40
-continued
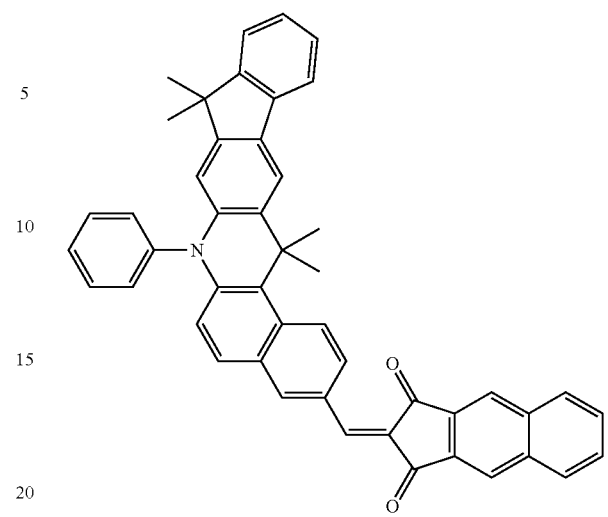
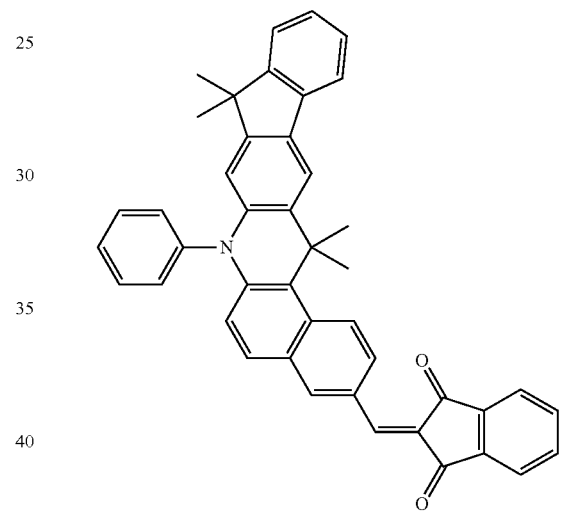
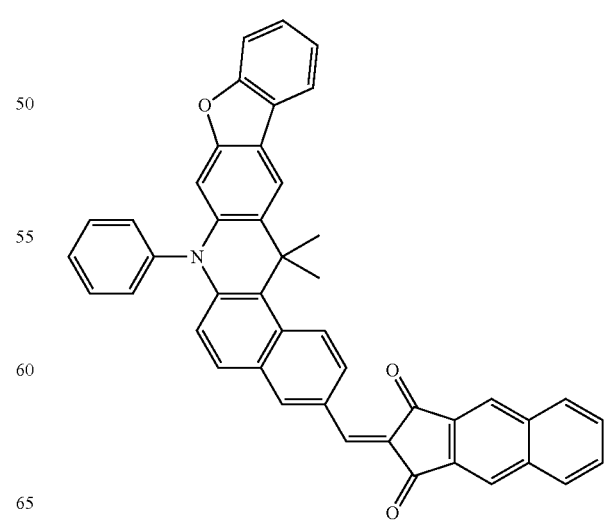

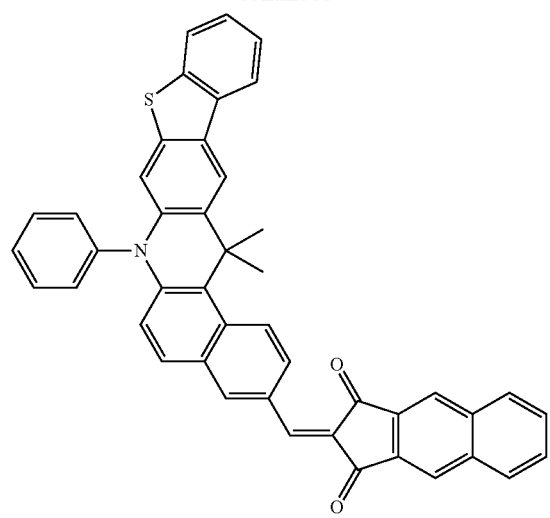
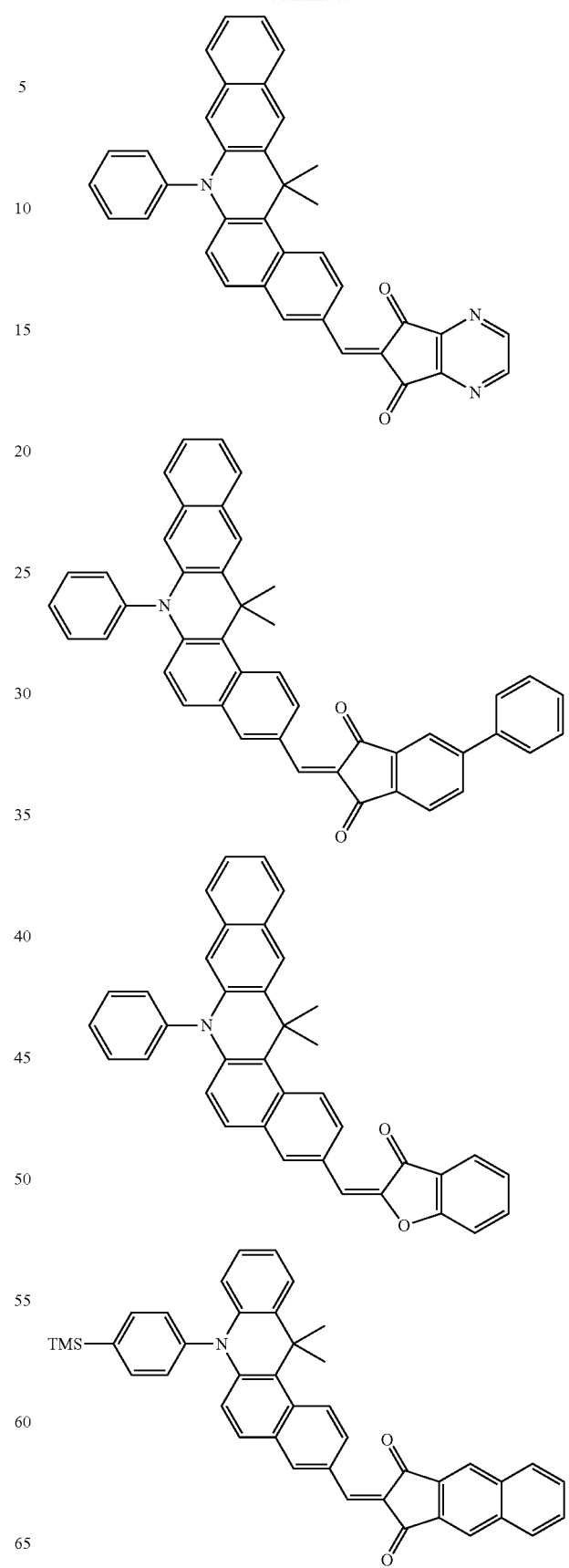

-continued
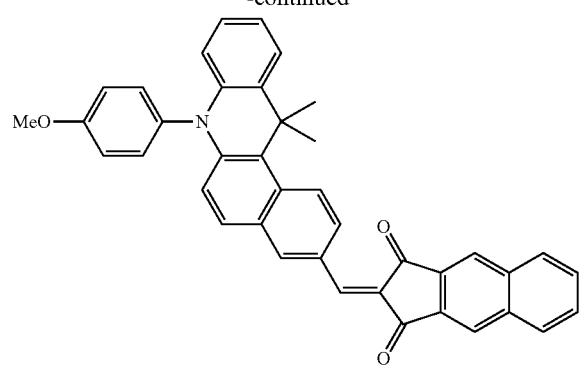
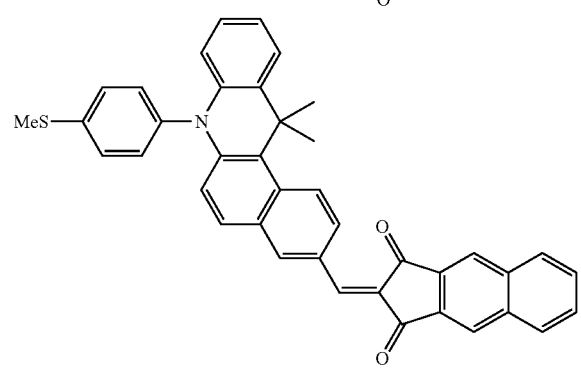
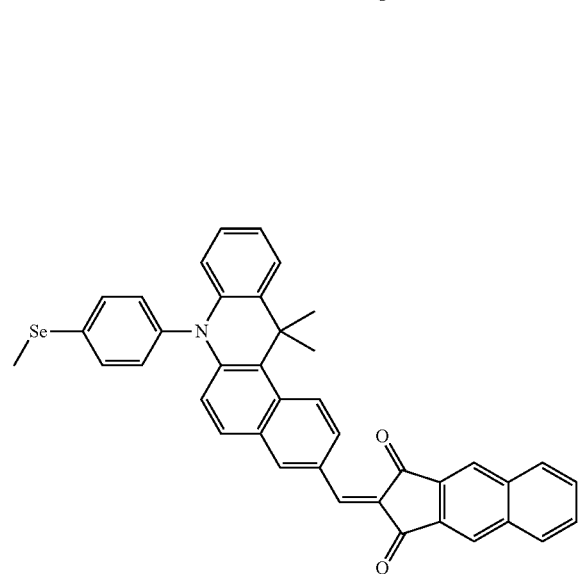
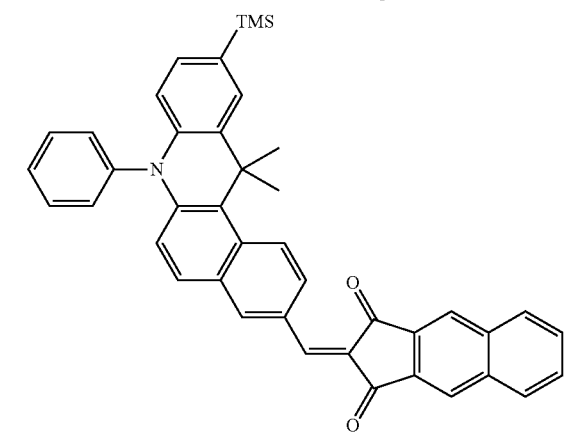
-continued
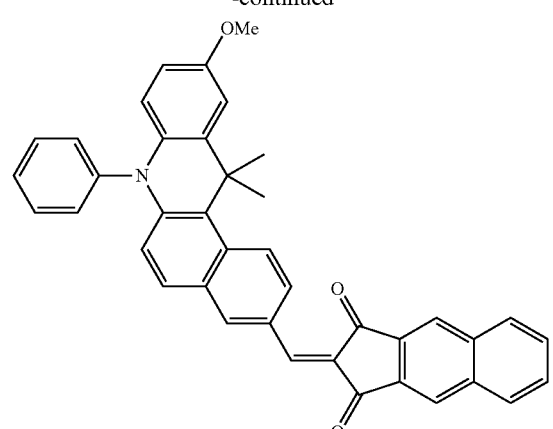
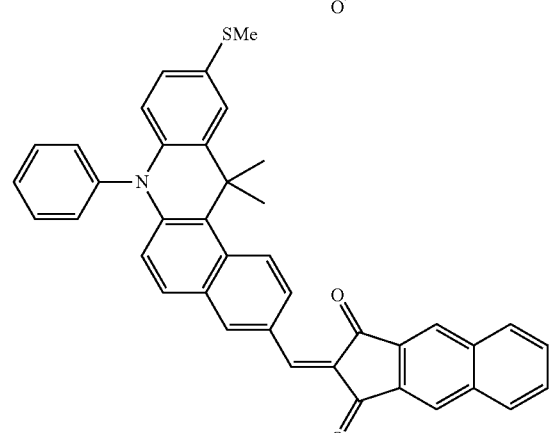
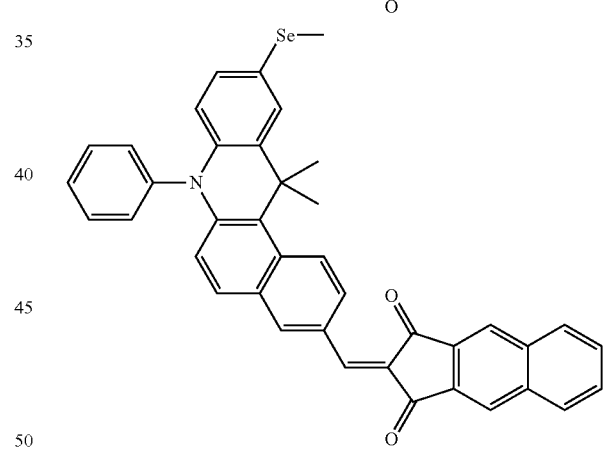
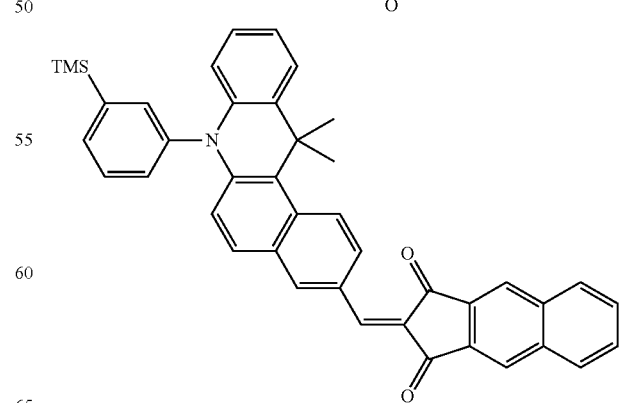

45
-continued
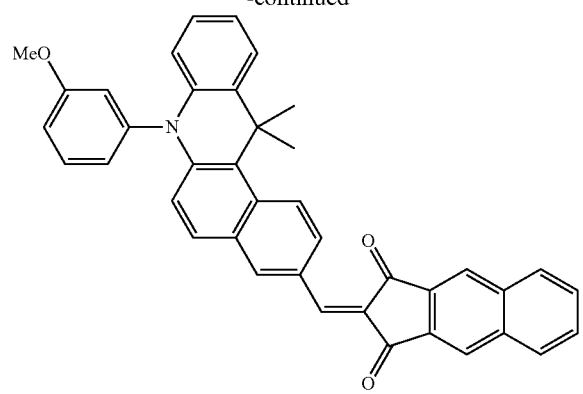
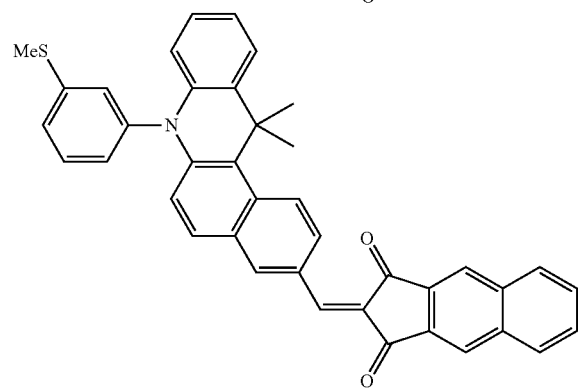
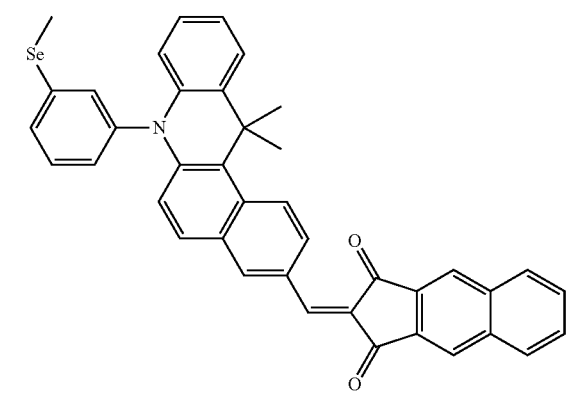
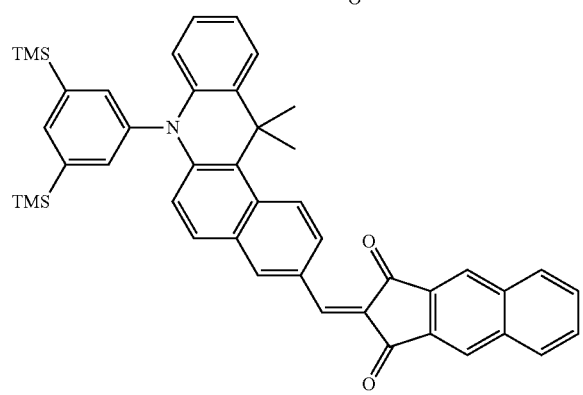
46
-continued
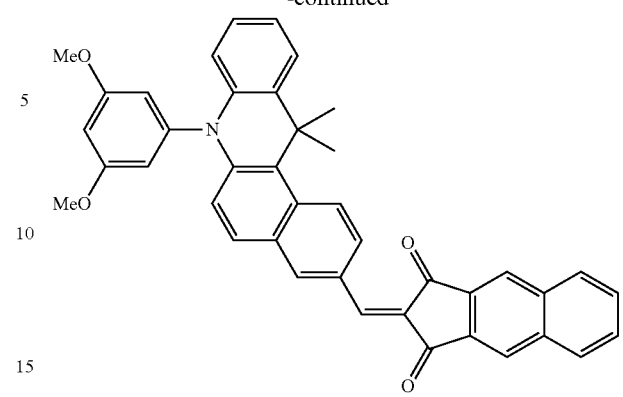
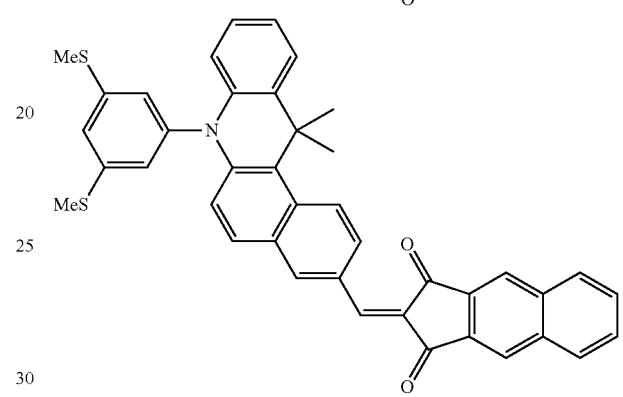
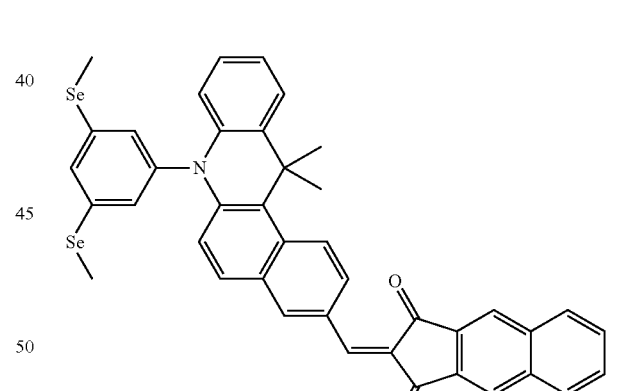
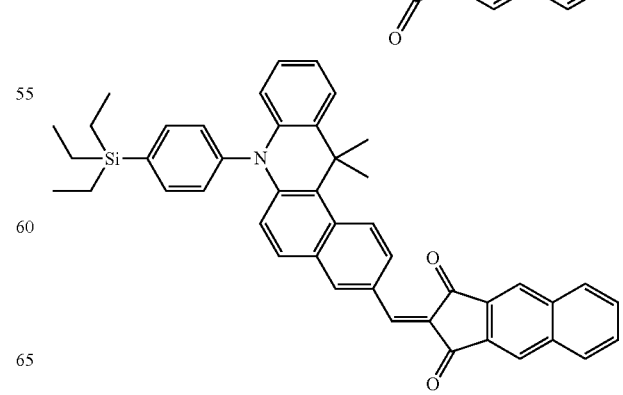

47
-continued
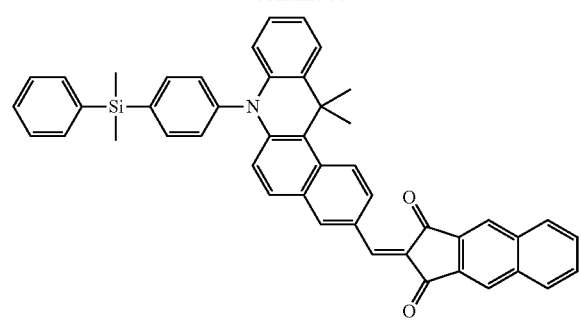
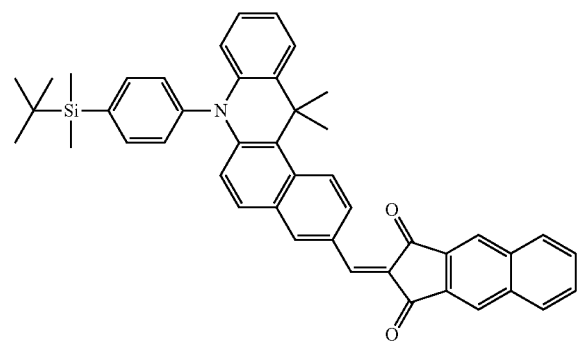
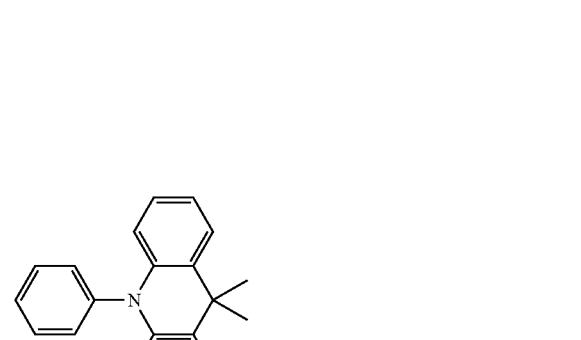
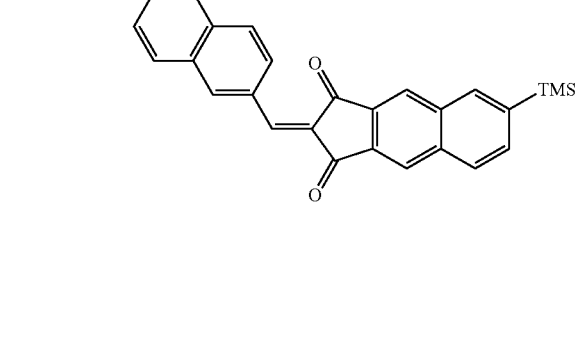
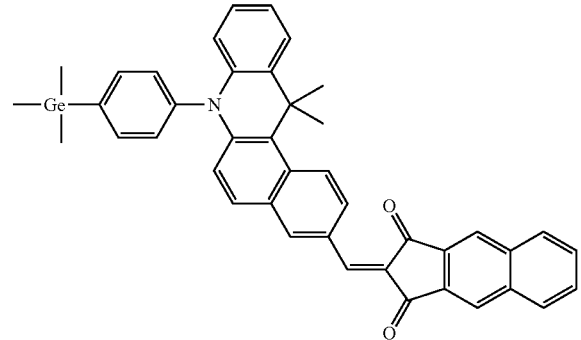
48
-continued
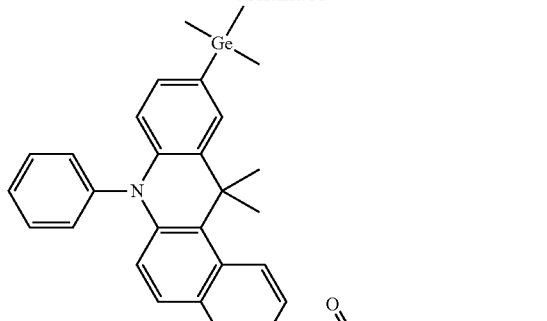
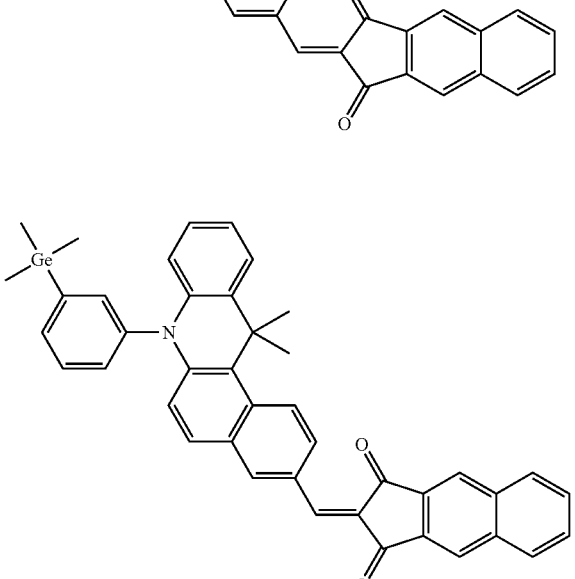
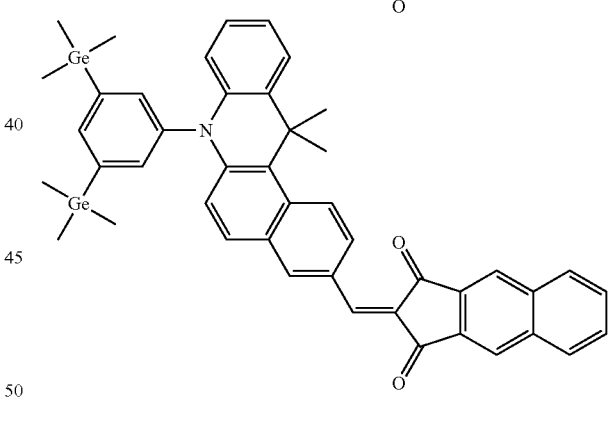
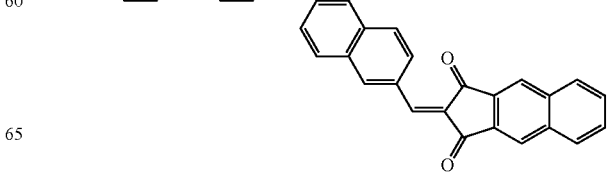

-continued
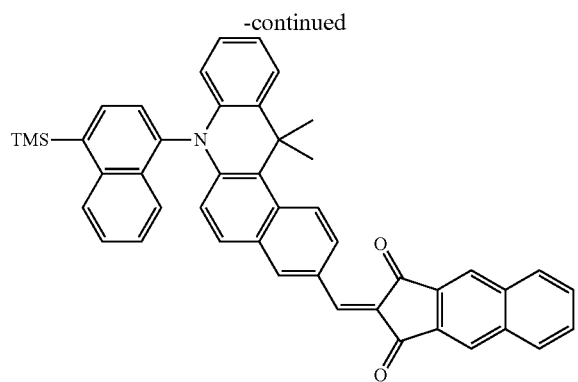
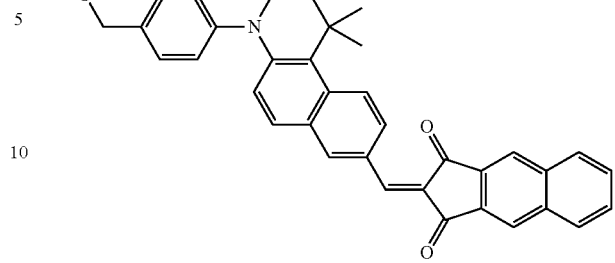
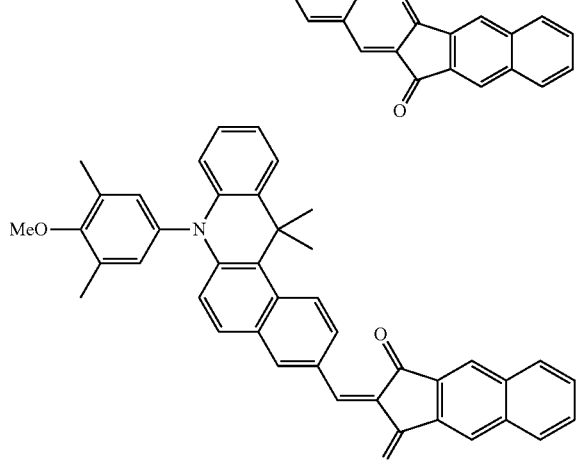
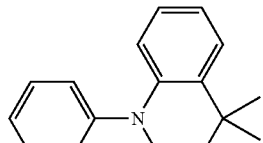
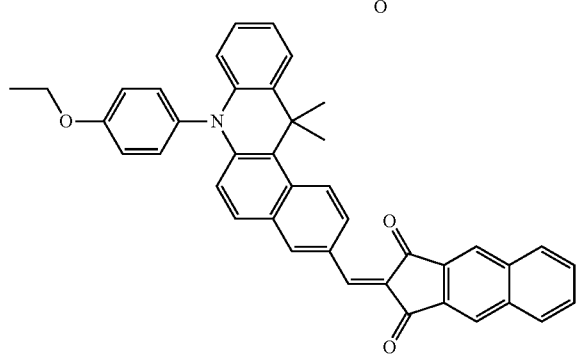
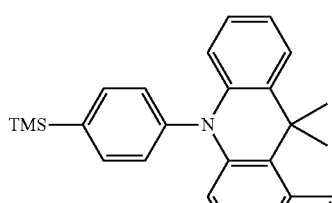
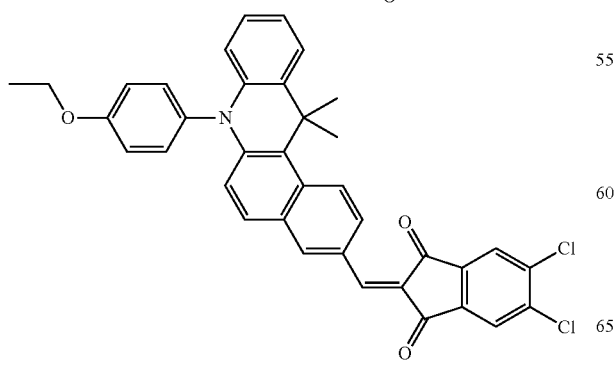
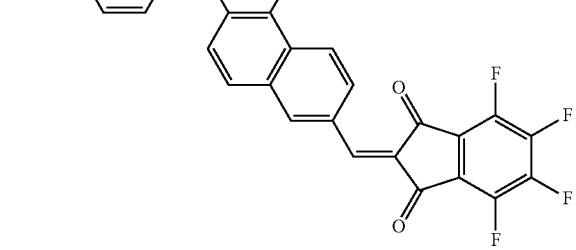

51
-continued
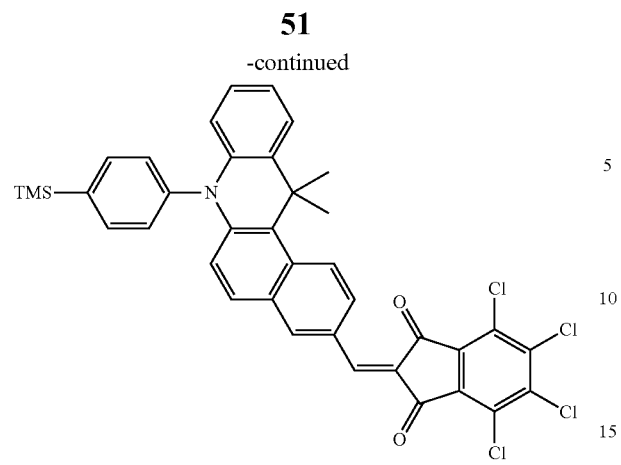
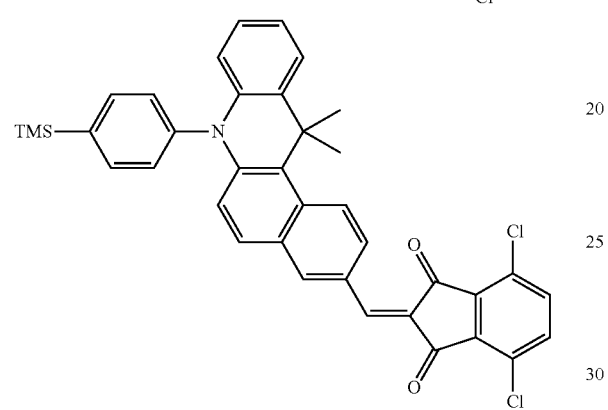
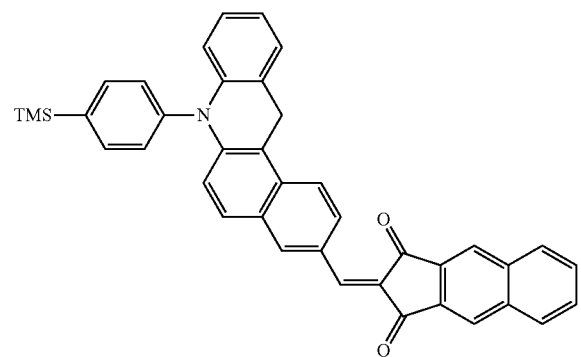
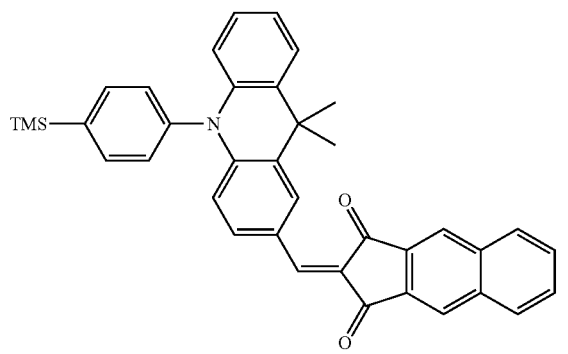
52
-continued
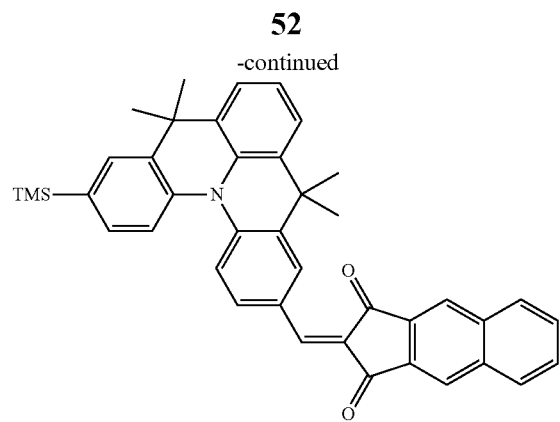
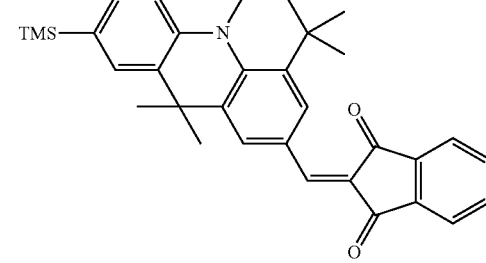
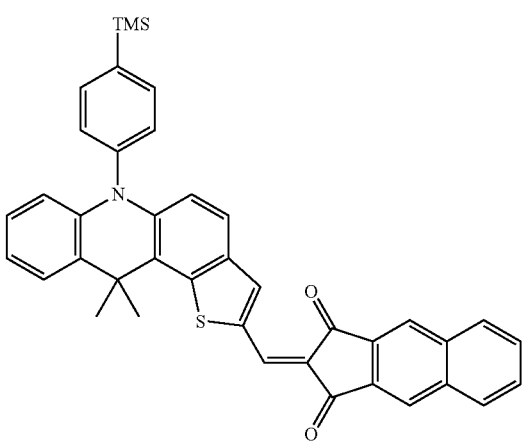
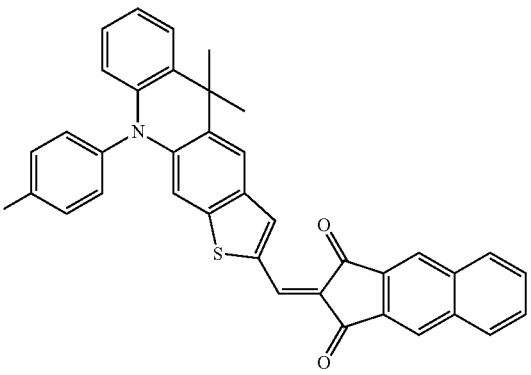

-continued

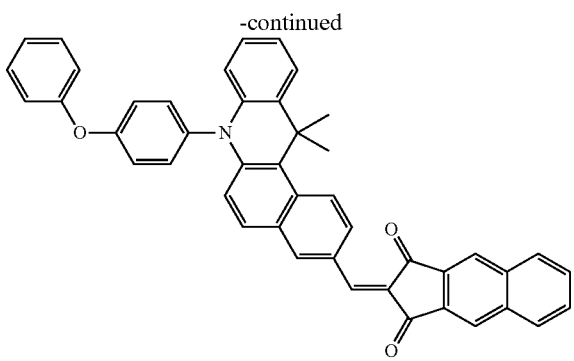

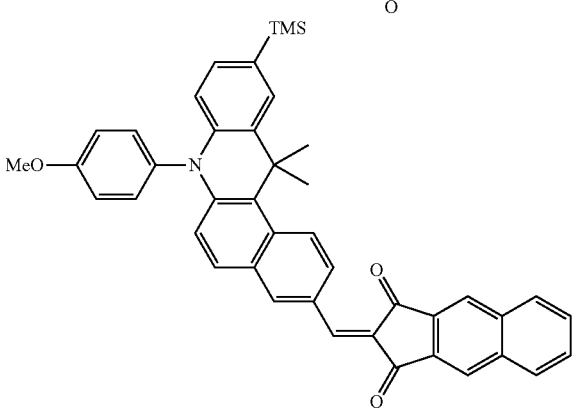

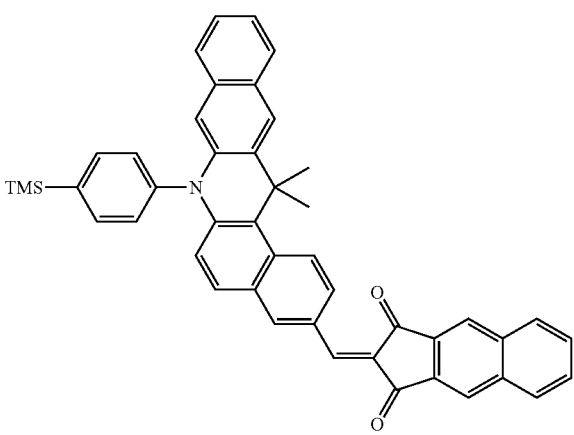

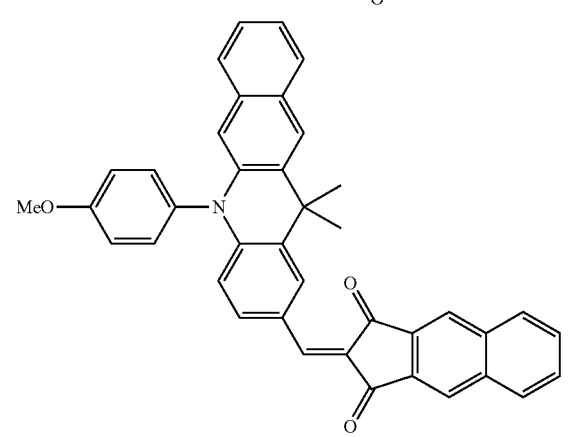

-continued

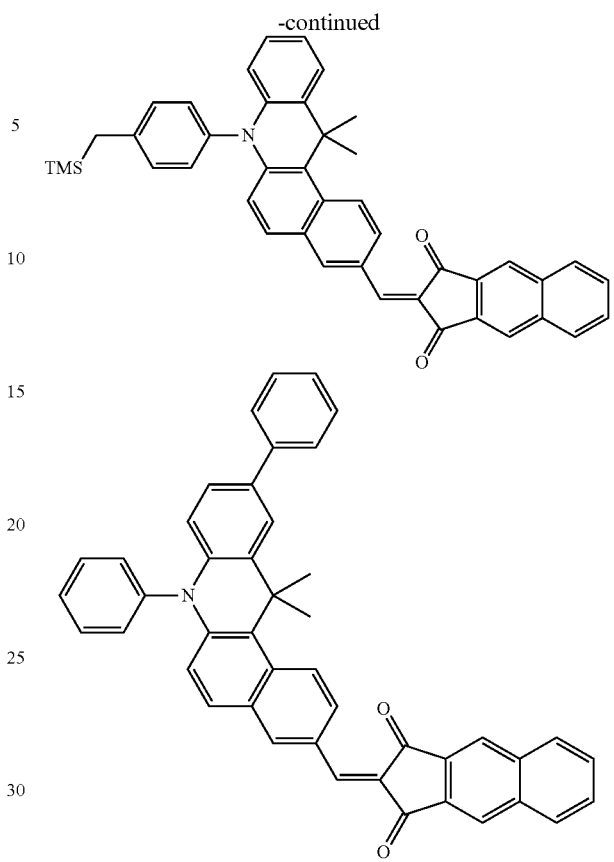

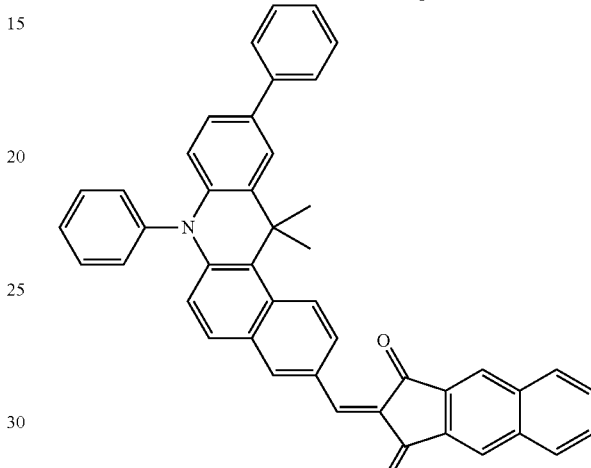

<n-Type Compound>

The n-type organic semiconductor (n-type compound) is an acceptor-type semiconductor. This material is mainly represented by an electron-transporting compound and refers to a compound that easily accepts electrons. More specifically, when two compounds are used by being brought into contact to each other, a compound showing a higher degree of electron affinity is called the n-type compound. Accordingly, as the acceptor-type semiconductor, any compounds can be used as long as they have electron-accepting properties. Preferable examples of the n-type compound include fullerenes, which are selected from the group consisting of fullerene and derivatives thereof, condensed aromatic carbon ring compounds (naphthalene derivatives, anthracene derivatives, phenanthrene derivatives, tetracene derivatives, pyrene derivatives, perylene derivatives, and fluoranthene derivatives), heterocyclic compounds containing nitrogen atoms, oxygen atoms, or sulphur atoms (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, tribenzazepine, and the like), a polyarylene compound, a fluorene compound, a cyclopentadiene compound, a silyl compound, metal complexes having nitrogen-containing heterocyclic compounds as ligands, and the like.

As the aforementioned n-type compound, fullerenes, which are selected from the group consisting of fullerene and derivatives thereof, are preferable. Fullerene refers to fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, or mixed fullerene, and fullerene derivatives refer to compounds obtained when a substituent is added to the fullerene. As the substituent of the fullerene derivatives, alkyl groups, aryl groups, or heterocyclic groups are preferable. As fullerene derivatives, the compounds described in JP 2007-123707 A are preferable.

It is preferable for the photoelectric conversion film to have a bulk-heterostructure which is formed in a state where the aforementioned p-type compound (preferably, the compound represented by the aforementioned Formula (W)) is mixed with the fullerenes. The bulk-heterostructure refers to a film in which a p-type compound and an n-type compound are mixed together and dispersed in the photoelectric conversion film. The structure can be formed by either a wet method or a dry method, but it is preferable to form the structure by a co-vapor deposition method. If a heterojunction structure is formed in the photoelectric conversion film, it is possible to make up for a defect of a short carrier diffusion length of the photoelectric conversion film and to improve the photoelectric conversion efficiency of the photoelectric conversion film. The bulk-heterojunction structure is described in detail in paragraphs [0013] and [0014] of JP 2005-303266 A and the like.

A ratio of the content of fullerenes to the total content of the p-type compound and the fullerenes (a film thickness expressed in terms of a single layer of the fullerenes/(a film thickness expressed in terms of a single layer of the p-type compound+a film thickness expressed in terms of a single layer of the fullerenes)) is preferably equal to or greater than 50% by volume, more preferably equal to or greater than 55% by volume, and even more preferably equal to or greater than 65% by volume. Although the upper limit thereof is not particularly limited, it is preferably equal to or less than 95% by volume, and more preferably equal to or less than 90% by volume.

<Film Forming Method>

The photoelectric conversion film can be formed by a dry film formation method or a wet film formation method. Specific examples of the dry film formation method include physical vapor deposition methods such as a vacuum vapor deposition method, a sputtering method, an ion plating method, and an MBE method and CVD methods such as plasma polymerization. As the wet film formation method, a casting method, a spin coating method, a dipping method, an LB method, and the like are used. Among these, a dry film formation method is preferable, and a vacuum vapor deposition method is more preferable. When the vacuum vapor deposition method is used for forming a film, production conditions including a degree of vacuum and a vapor deposition temperature can be set according to common methods.

Although the thickness of the photoelectric conversion film is not particularly limited, it is preferably from 10 nm to 1,000 nm, more preferably from 50 nm to 800 nm, and particularly preferably from 100 nm to 500 nm.

[Electrode]

The electrodes (the upper electrode (transparent conductive film) and the lower electrode (conductive film)) are configured with a conductive material. As the conductive material, a metal, an alloy, a metal oxide, an electroconductive compound, a mixture of these, and the like can be used.

In a case where light enters the photoelectric conversion film through the transparent conductive film, the upper electrode is preferably transparent enough to the light to be detected. Specific examples of the material of the upper electrode include conductive metal oxides such as tin oxide doped with antimony, fluorine, or the like (ATO or FTO), tin oxide, zinc oxide, indium oxide, indium tin oxide (ITO), and indium zinc oxide (IZO), thin films of metal such as gold, silver, chromium, and nickel, mixtures or laminates composed of the metals and conductive metal oxides described above, inorganic conductive substances such as copper iodide and copper sulphide, organic conductive materials such as polyaniline, polythiophene, and polypyrrole, laminates composed of the organic conductive materials and ITO, and the like. Among these, in view of high conductivity, transparency, and the like, transparent conductive metal oxides are preferable.

When a transparent conductive film such as TCO (transparent conductive oxide) is used as the upper electrode, a DC short circuit or increase in a leakage current occurs in some cases. As one of the reasons, it is considered that fine cracks formed in the photoelectric conversion film may be covered with a dense film such as TCO, and accordingly, conduction may occur to a higher extent between the upper electrode and the lower electrode at the opposite side. Therefore, in the case of an electrode such as Al that is relatively poor in terms of film quality, increase in a leakage current does not easily occur. If a film thickness of the upper electrode is controlled relative to a film thickness (that is, a depth of crack) of the photoelectric conversion film, the increase in a leakage current can be suppressed to a large extent. A thickness of the upper electrode is desirably controlled to be equal to or smaller than one fifth of a thickness of the photoelectric conversion film, and more desirably controlled to be equal to or smaller than one tenth of a thickness of the photoelectric conversion film.

Generally, when the thickness of the conductive film is decreased out of a certain range, a value of resistance rapidly increases. However, in a solid-state imaging device including the photoelectric conversion element according to the present embodiment, a sheet resistance may be preferably 100 Ω/square to 10,000 Ω/square, and the conductive film can be made into a thin film within a range of film thickness that can be set with a high degree of freedom. In addition, the thinner the upper electrode (transparent conductive film) is, the smaller the amount of absorbed light becomes, and a light transmittance is increased in general. The increase in light transmittance is extremely preferable since amount of light absorbed into the photoelectric conversion film is increased, and thus a photoelectric conversion ability is enhanced. Considering the suppression of leakage current, increase in a value of resistance of the thin film, and increase in the transmittance that result from reduction of film thickness, the film thickness of the upper electrode is preferably 5 nm to 100 nm, and more preferably 5 nm to 20 nm.

According to the use, sometimes transparency is provided to the lower electrode, or inversely, sometimes a light-reflecting material is used as the lower electrode instead of providing transparency thereto. Specific examples of the material of the lower electrode include conductive metal oxides such as tin oxide doped with antimony, fluorine, or the like (ATO or FTO), tin oxide, zinc oxide, indium oxide, indium tin oxide (ITO), and indium zinc oxide (IZO), metals such as gold, silver, chromium, nickel, titanium, tungsten, and aluminum, conductive compounds such as oxides or nitrides of the aforementioned metals (for example, titanium nitride (TiN)), mixtures or laminates composed of the aforementioned metals and conductive metal oxides, inorganic conductive substances such as copper iodide and copper sulfide, organic conductive materials such as polyaniline, polythiophene, and polypyrrole, laminates composed of the organic conductive materials and ITO or titanium nitride, and the like.

A method for forming the lower electrode is not particularly limited, and can be appropriately selected considering aptitude for the electrode material. Specifically, the lower electrode can be formed by a wet method such as a printing method or a coating method, a physical method such as a vacuum vapor deposition method, a sputtering method, and an ion plating method, a chemical method such as CVD or a plasma CVD method, and the like.

When ITO is used as the electrode material, the lower electrode can be formed by methods such as an electron beam method, a sputtering method, a resistance heating type vapor deposition method, a chemical reaction method (a sol-gel method or the like), and coating of a dispersion of indium tin oxide.

Moreover, UV-ozone processing, plasma processing, or the like can be performed on the film prepared using ITO. When TiN is used as the electrode material, various methods including a reactive sputtering method are used, and UV-ozone processing, plasma processing, or the like can be further performed.

[Hole Blocking Layer]

The photoelectric conversion element of the present invention may have a hole blocking layer.

For the hole blocking layer, an electron-accepting organic material can be used.

As the electron-accepting organic material, it is possible to use oxadiazole derivatives such as 1,3-bis(4-tert-butylphenyl-1,3,4-oxadiazolyl)phenylene (OXD-7), anthraquinodimethane derivatives, diphenylquinone derivatives, bathocuproin, bathophenanthroline, derivatives of these, a triazole compound, a tris(8-hydroxyquinolinato)aluminum complex, a bis(4-methyl-8-quinolinato)aluminum complex, distyrylarylene derivatives, a silole compound, and the like. Moreover, materials other than the electron-accepting organic material can also be used as long as the materials exhibit sufficient electron transporting ability. For example, a porphyrin-based compound, a styryl-based compound such as DCM (4-dicyanomethylene-2-methyl-6-(4-(dimethylaminostyryl))-4H pyran), a 4H pyran-based compound can be used. Specifically, the compounds described in paragraphs [0073] to [0078] of JP 2008-72090 A are preferable.

A method for producing the hole blocking layer is the same as the aforementioned method for producing the electron blocking layer.

[Substrate]

The photoelectric conversion element of the present invention may further include a substrate. The type of substrate to be used is not particularly limited, and it is possible to use a semiconductor substrate, a glass substrate, or a plastic substrate.

The position of the substrate is not particularly limited. Generally, on the substrate, a conductive film, a photoelectric conversion film, and a transparent conductive film are laminated on one another in this order.

[Sealing Layer]

The photoelectric conversion element of the present invention may further include a sealing layer. In the presence of factors such as water molecules that deteriorate the photoelectric conversion material, performance of the material markedly deteriorates in some cases. If the entire photoelectric conversion film is covered and sealed with a dense sealing layer that does not allow water molecules to permeate the film, such as ceramics like metal oxide, metal nitride, and metal nitride oxide or diamond-like carbon (DLC), the deterioration described above can be prevented.

The selection of material of the sealing layer and production of the sealing layer may be performed according to the description in paragraphs [0210] to [0215] of JP 2011-082508 A.

[Photosensor]

The photoelectric conversion element of the present invention can be used as, for example, a solar cell or a photosensor. It is preferable for the photoelectric conversion element of the present invention to be used as a photosensor. The photosensor may use only a single photoelectric conversion element. Alternatively, the photosensor may be preferably in the form of a line sensor in which the photoelectric conversion elements are arranged in a straight line, or in the form of a two-dimensional sensor in which the photoelectric conversion elements are arranged on a plane. In a line sensor, the photoelectric conversion element of the present invention functions as an imaging device by converting optical image information into electric signals by using an optical system and a driving portion just like a scanner. In a two-dimensional sensor, the photoelectric conversion element of the present invention functions as an imaging device by converting optical image information into electric signal by forming an image on the sensor by using an optical system just like an imaging module.

A photoelectric cell is a power-generating apparatus. Accordingly, efficiency in converting light energy into electric energy is regarded as an important performance, but dark currents which are electric currents generated in a dark place do not cause a problem for the performance thereof. Moreover, the photoelectric cell does not require a heating process at the latter stage such as installation of a color filter. For the photosensor, conversion of brightness signals into electric signals with a high accuracy is regarded as an important performance, and consequentially, efficiency in converting amount of light into electric current is also an important performance. However, when being output in a dark place, the signals become noise, and accordingly, a low level of dark currents is required. Furthermore, the resistance to the process of a latter stage is also important.

[Imaging Device]

Next, an example of a configuration of an imaging device having the photoelectric conversion element will be described.

In the example of a configuration described below, members and the like having the same configuration and function as the members and the like which have already been described are marked with the same signs or corresponding signs in the drawing, and description thereof is simplified or skipped.

An imaging device is a device that converts optical information of an image into electric signals. In this device, plural photoelectric conversion elements are arranged in a matrix form in the same plane. An optical signal is converted into an electric signal in each of the photoelectric conversion elements (pixels), and the electric signal can be sequentially output outside the imaging device for each image. Accordingly, each pixel is configured with one photoelectric conversion element and one or more transistors.

Figure 2:
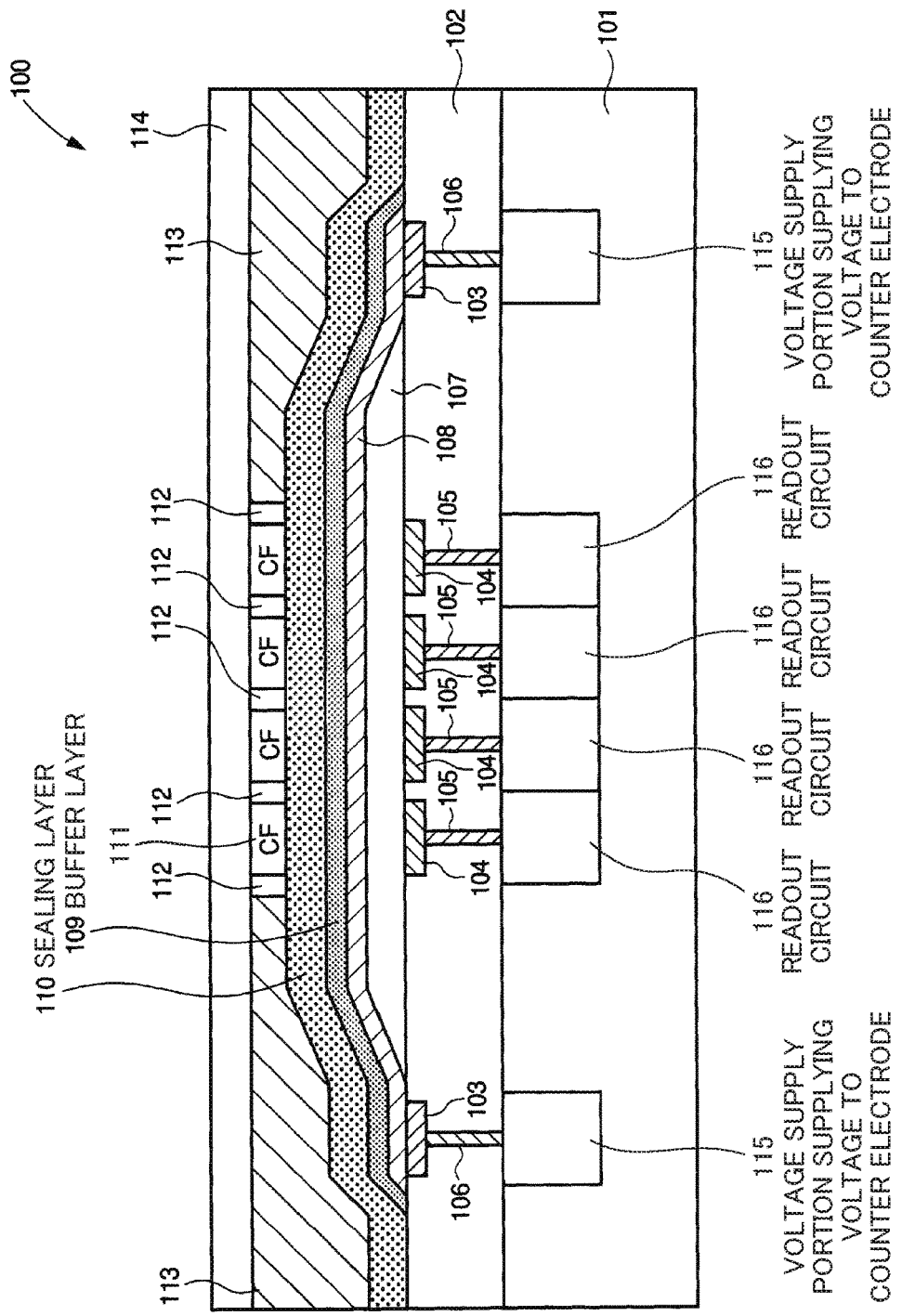
FIG. 2 is a schematic cross-sectional view of one pixel of an imaging device.

FIG. 2 is a cross-sectional view showing a schematic configuration of an imaging device for describing an embodiment of the present invention. The imaging device is used by being mounted on imaging apparatuses such as digital cameras or digital video cameras, electronic endoscopes, imaging modules of cellular phones, and the like.

The imaging device has plural photoelectric conversion elements shown in FIGS. 1A and 1B, and a circuit board on which readout circuits that read out signals corresponding to the charge generated by the photoelectric conversion film of each photoelectric conversion element are formed. The imaging device has a configuration in which plural photoelectric conversion elements are arranged one-dimensionally or two-dimensionally on the same plane positioned above the circuit board.

An imaging device 100 shown in FIG. 2 has a substrate 101, an insulating layer 102, a connection electrode 103, a pixel electrode (lower electrode) 104, a connection portion 105, a connection portion 106, a photoelectric conversion layer 107 composed of a photoelectric conversion film and an electron blocking layer, a counter electrode (upper electrode) 108, a buffer layer 109, a sealing layer 110, a color filter (CF) 111, a partition 112, a light-shielding layer 113, a protective layer 114, a voltage supply portion 115 supplying voltage to the counter electrode, and a readout circuit 116.

The pixel electrode 104 has the same function as the lower electrode 11 of the photoelectric conversion element 10a shown in FIGS. 1A and 1B. The counter electrode 108 has the same function as the upper electrode 15 of the photoelectric conversion element 10a shown in FIGS. 1A and 1B. The photoelectric conversion layer 107 has the same configuration as the layer disposed between the lower electrode 11 and the upper electrode 15 of the photoelectric conversion element 10a shown in FIGS. 1A and 1B.

The substrate 101 is a glass substrate or a semiconductor substrate such as Si. The insulating layer 102 is formed on the substrate 101. On the surface of the insulating layer 102, plural pixel electrodes 104 and plural connection electrodes 103 are formed.

The photoelectric conversion layer 107 is a layer that is disposed on plural pixel electrodes 104 to cover the electrodes and shared by all of the photoelectric conversion elements.

The counter electrode 108 is an electrode that is disposed on the photoelectric conversion layer 107 and shared by all of the photoelectric conversion elements. The counter electrode 108 is formed such that it reaches the top of the connection electrode 103 disposed outside the photoelectric conversion layer 107, and is electrically connected to the connection electrode 103.

The connection portion 106 is embedded in the insulating layer 102, and is a plug or the like which is for electrically connecting the connection electrode 103 to the voltage supply portion 115 that supplies voltage to the counter electrode. The voltage supply portion 115 is formed in the substrate 101, and applies predetermined voltage to the counter electrode 108 through the connection portion 106 and the connection electrode 103. When the voltage that should be applied to the counter electrode 108 is higher than the power supply voltage of the imaging device, the voltage supply portion 115 supplies the predetermined voltage by increasing the power supply voltage by using a boosting circuit such as a charge pump.

The readout circuit 116 is disposed in the substrate 101 in an association with each of the plural pixel electrodes 104, and reads out the signal corresponding to the charge collected by the corresponding pixel electrode 104. The readout circuit 116 is configured with, for example, a CCD, CMOS, or TFT circuit, and is shielded from light by a light-shielding layer (not shown in the drawing) disposed inside the insulating layer 102. The readout circuit 116 is electrically connected to the pixel electrode 104 corresponding thereto through the connection portion 105.

The buffer layer 109 is formed on the counter electrode 108 while covering the counter electrode 108. The sealing layer 110 is formed on the buffer layer 109 while covering the buffer layer 109. The color filter 111 is formed on the sealing layer 110, in a position facing each pixel electrode 104. The partition 112 is disposed between color filters 111 and is for increasing light transmitting efficiency of the color filter 111.

The light-shielding layer 113 is formed on the sealing layer 110, in a position outside the region in which the color filter 111 and the partition 112 are disposed. The light-shielding layer 113 prevents light from entering the photoelectric conversion layer 107 that is formed in a position outside an effective pixel region. The protective layer 114 is formed on the color filter 111, the partition 112, and the light-shielding layer 113 and protects the entire imaging device 100.

When light enters the imaging device 100 configured as above, the light enters the photoelectric conversion layer 107, and charges are generated in the layer. Among the generated charges, holes are collected by the pixel electrode 104, and voltage signals corresponding to the amount of holes are output outside the imaging device 100 by the readout circuit 116.

A method for producing the imaging device 100 is as follows.

On the circuit board in which the voltage supply portion 115 that supplies voltage to the counter electrode and the readout circuit 116 have been formed, the connection portions 105 and 106, plural connection electrodes 103, plural pixel electrodes 104, and the insulating layer 102 are formed. The plural pixel electrodes 104 are arranged on the surface of the insulating layer 102, in the form of, for example, a square lattice.

Thereafter, on the plural pixel electrodes 104, the photoelectric conversion layer 107 composed of an electron blocking layer and a photoelectric conversion film is formed by, for example, a vacuum heating vapor deposition method. Then, on the photoelectric conversion layer 107, the counter electrode 108 is formed by, for example, a sputtering method in a vacuum. Subsequently, on the counter electrode 108, the buffer layer 109 and the sealing layer 110 are formed in this order by, for example, a vacuum heating vapor deposition method. Thereafter, the color filter 111, the partition 112, and the light-shielding layer 113 are formed, and then the protective layer 114 is formed, and as a result, the imaging device 100 is completed.

In the method for producing the imaging device 100, even if a process of placing the imaging device 100, which is being prepared, in a non-vacuum environment is added between the process of forming the photoelectric conversion layer 107 and the process of forming the sealing layer 110, it is possible to prevent performance deterioration of the plural photoelectric conversion elements. If such a process is added, it is possible to reduce the production cost while preventing performance deterioration of the imaging device 100.

EXAMPLES

Hereinafter, the present invention will be described in more detail according to examples, but the present invention is not limited thereto.

Example 1

The photoelectric conversion element in the form shown in FIG. 1A was prepared. Herein, the photoelectric conversion element is configured with the lower electrode 11, the electron blocking layer 16A, the photoelectric conversion film 12, and the upper electrode 15.

Specifically, on a glass substrate, amorphous ITO is formed into a film by a sputtering method, thereby forming the lower electrode 11 (thickness: 30 nm). Thereafter, on the lower electrode 11, the following compound (1) was formed into a film by a vacuum heating vapor deposition method, thereby forming the electron blocking film 16A (thickness: 100 nm).

Moreover, in a state where the substrate temperature was being controlled to be 25° C., on the electron blocking layer 16A, the following compound A (p-type compound) and fullerene ($C_{60}$) were co-deposited and formed into a film by vacuum heating vapor deposition such that the thickness thereof became 100 nm and 300 nm respectively in terms of a single layer, thereby forming the photoelectric conversion film 12. The vacuum vapor deposition of the photoelectric conversion film was performed under a degree of vacuum of equal to or less than $4 \times 10^{-4}$ Pa.

Furthermore, on the photoelectric conversion film 12, amorphous ITO was formed into a film by a sputtering method, thereby forming the upper electrode 15 (transparent conductive film) (thickness: 10 nm). On the upper electrode 15, a SiO film was formed as a sealing layer by heating vapor deposition, and on this film, an aluminum oxide ($Al_2O_3$) layer was formed by an ALCVD method, thereby preparing the photoelectric conversion element.

Examples 2 to 16 and Comparative examples 1 to 6

Photoelectric conversion elements were prepared according to the same procedure as in Example 1, except that electron blocking materials shown in Table 1 were used instead of the compound (1), and the following compound B (p-type compound) was used instead of the compound A in Examples 9 to 16 and Comparative examples 4 to 6. The following comparative compound 4 (total number of carbon atoms: 34) failed to be vapor-deposited, and hence a photoelectric conversion element could not be prepared.

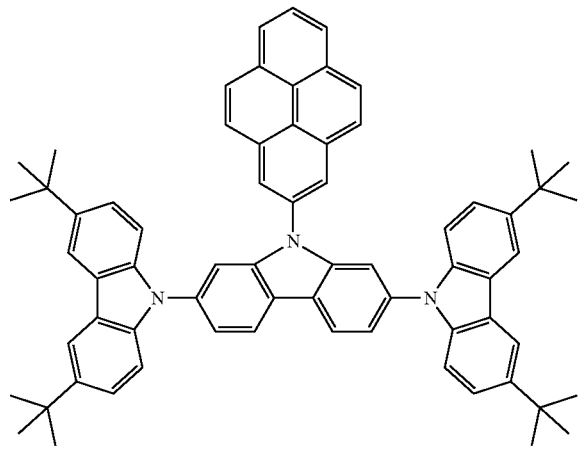

Compound (1)

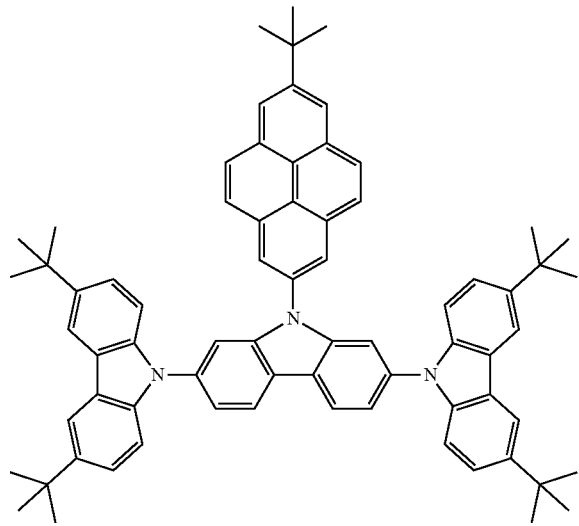

Compound (2)

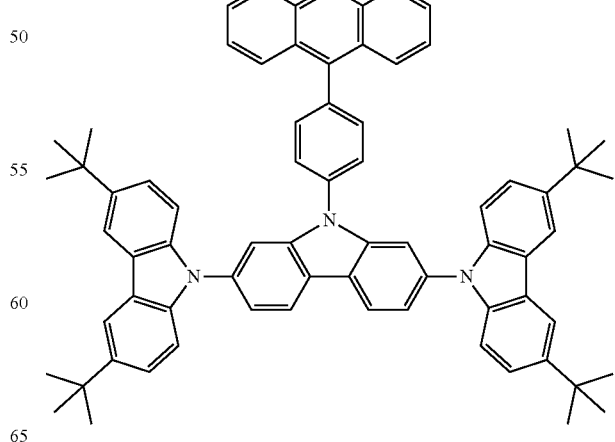

Compound (3)

Compound (4)
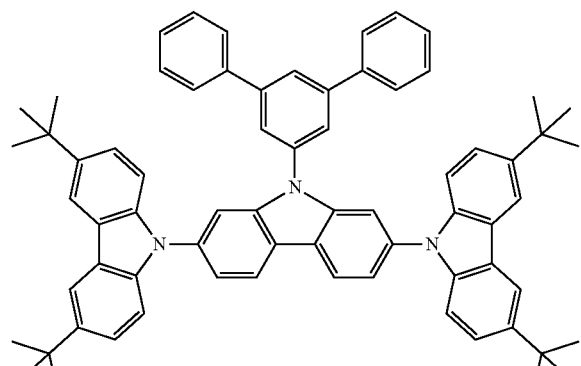
Compound (5)
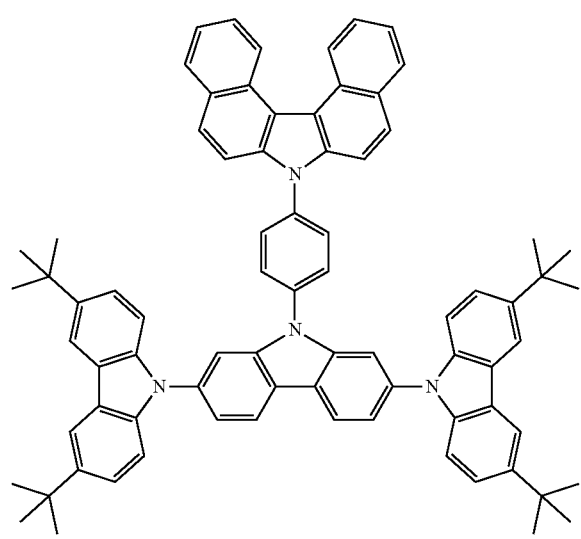
Compound (6)
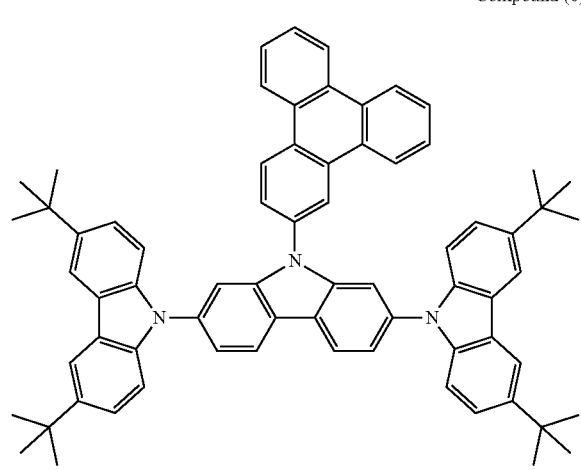
Compound (7)
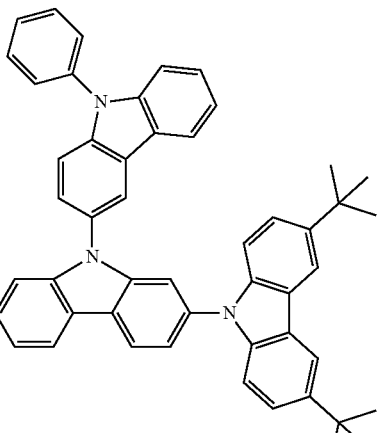
Compound (8)
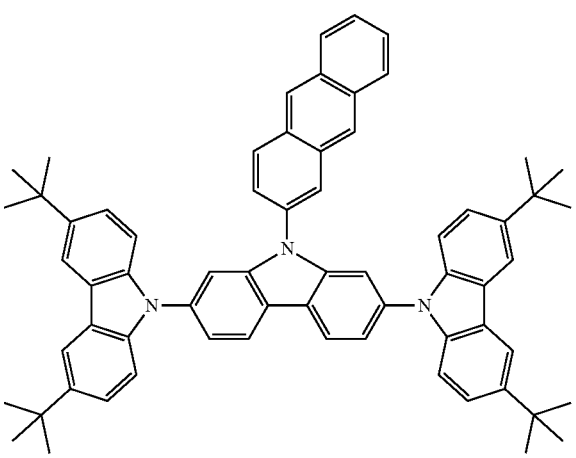
Comparative compound 1

Comparative compound 2

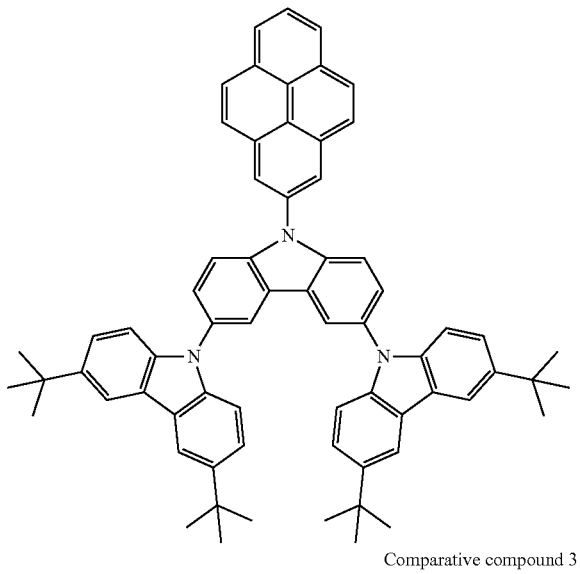

Comparative compound 3

Comparative compound 4

The total number of carbon atoms in Table 1 shows the aforementioned total number of carbon atoms of each electron blocking material.

Compound A

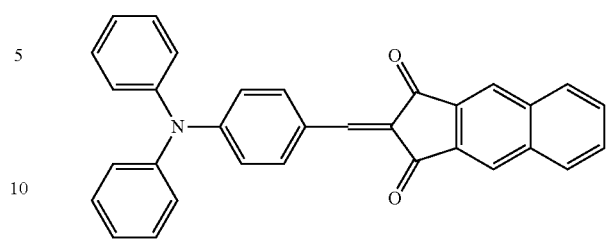

Compound B

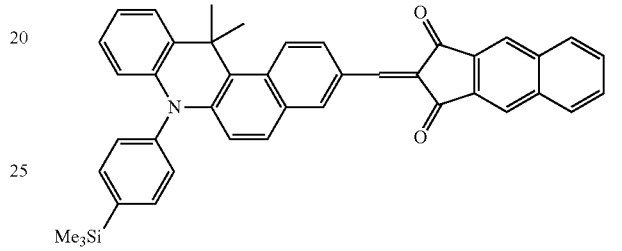

<Evaluation of Heat Resistance>

For the obtained photoelectric conversion elements, the change of a value of dark currents resulting from heating was investigated.

Specifically, for each element, a value of dark currents at the time of applying voltage ($5 \times 10^4$ V/cm) was measured. Thereafter, each element was heated on a hot plate (215° C., for 15 minutes) and then cooled to room temperature, and then a value of dark currents at the time of applying voltage ($5 \times 10^4$ V/cm) was measured. Subsequently, the value of dark currents after heating relative to the value of dark currents before heating was determined. The results are shown in Table 1 (heat resistance). The smaller the relative values, the better the heat resistance.

<Evaluation of Responsiveness>

In a state where an electric field of $5 \times 10^4$ V/cm was applied, the obtained photoelectric conversion elements were irradiated with light from the upper electrode (transparent conductive film) side, and a rise time taken for the signal intensity to reach 90% from 0% at this time was measured. Table 1 shows relative values obtained on the assumption that the rise time of Example 1 is 1 (responsiveness). The smaller the relative values, the shorter the rise time, and the better the responsiveness.

TABLE 1

| | Electron blocking material | Total number of carbon atoms | p-type compound | Heat resistance | Responsiveness |
|---|---|---|---|---|---|
| Example 1 | Compound (1) | 16 | Compound A | 0.8 | 1 |
| Example 2 | Compound (2) | 16 | Compound A | 0.7 | 1 |
| Example 3 | Compound (3) | 20 | Compound A | 0.9 | 1.2 |
| Example 4 | Compound (4) | 18 | Compound A | 1.1 | 1.2 |
| Example 5 | Compound (5) | 26 | Compound A | 0.9 | 1.2 |
| Example 6 | Compound (6) | 18 | Compound A | 0.8 | 1.1 |
| Example 7 | Compound (7) | 18 | Compound A | 0.9 | 1.2 |
| Example 8 | Compound (8) | 18 | Compound A | 1 | 1.2 |
| Example 9 | Compound (1) | 16 | Compound B | 0.8 | 0.9 |
| Example 10 | Compound (2) | 16 | Compound B | 0.8 | 0.9 |
| Example 11 | Compound (3) | 20 | Compound B | 0.9 | 1 |
| Example 12 | Compound (4) | 18 | Compound B | 1 | 1.1 |
| Example 13 | Compound (5) | 26 | Compound B | 0.9 | 1.1 |
| Example 14 | Compound (6) | 18 | Compound B | 0.8 | 1 |
| Example 15 | Compound (7) | 18 | Compound B | 0.9 | 1.2 |
| Example 16 | Compound (8) | 18 | Compound B | 0.9 | 1.2 |
| Comparative example 1 | Comparative compound 1 | 14 | Compound A | 1.5 | 1.6 |
| Comparative example 2 | Comparative compound 2 | 16 | Compound A | 1.8 | 1.9 |
| Comparative example 3 | Comparative compound 3 | 10 | Compound A | 2.2 | 1.7 |
| Comparative example 4 | Comparative compound 1 | 14 | Compound B | 1.4 | 1.5 |
| Comparative example 5 | Comparative compound 2 | 16 | Compound B | 1.7 | 1.6 |
| Comparative example 6 | Comparative compound 3 | 10 | Compound B | 1.9 | 1.5 |

As is evident from Table 1, compared to Comparative examples 1 to 6 in which the electron blocking layer did not contain the compound represented by Formula (1) described above, Examples 1 to 16, in which the electron blocking layer contained the compound represented by Formula (1) described above, exhibited better heat resistance and responsiveness.

Particularly, Examples 9 to 16 in which the photoelectric conversion film contained the compound represented by Formula (W2) described above exhibited better responsiveness.

Through the comparison between Examples 1 to 8, it was confirmed that heat resistance was better in Examples 1, 2, and 6 in which $R_1$ in Formula (1) represents a condensed-ring aromatic hydrocarbon group that may have a substituent, and the condensed ring constituting the condensed-ring aromatic hydrocarbon group consisted of four or more benzene rings. Particularly, Examples 1 and 2, in which $R_1$ in Formula (1) was a group represented by Formula (A) described above, exhibited better responsiveness.

Furthermore, through the comparison between Examples 9 to 16, it was confirmed that heat resistance was better in Examples 9, 10, and 14 in which $R_1$ in Formula (1) represents a condensed-ring aromatic hydrocarbon group that may have a substituent, and the condensed ring constituting the condensed-ring aromatic hydrocarbon group consisted of four or more benzene rings. Particularly, Examples 9 and 10, in which $R_1$ in Formula (1) was a group represented by Formula (A) described above, exhibited better responsiveness.

<Preparation of Imaging Device>

In the same form as shown in FIG. 2, an imaging device was prepared. That is, on a CMOS substrate, amorphous ITO was formed into a film of 30 nm by a sputtering method, and then a pixel electrode was formed by performing patterning by photolithography such that one pixel was formed on each photodiode (PD) on the CMOS substrate. Thereafter, the process from the formation of an electron blocking layer was performed according to the same procedure as in Examples 1 to 16 and Comparative examples 1 to 6, thereby preparing an imaging device. The imaging device was also evaluated in the same manner as described above, and the same results as shown in Table 1 were obtained. Consequentially, it was understood that the photoelectric conversion element of the present invention exhibits excellent heat resistance and responsiveness, even in a case where it is used as an imaging device.

What is claimed is:

1. A photoelectric conversion element comprising:
a transparent conductive film;
a conductive film; and
a photoelectric conversion film and an electron blocking layer which are disposed between the transparent conductive film and the conductive film,
wherein the electron blocking layer contains a compound represented by the following Formula (1),

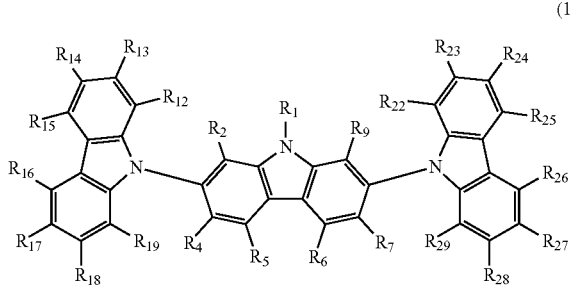

(1)

(in Formula (1), $R_1$ is a condensed-ring aromatic hydrocarbon group which may have a substituent or a group which is represented by the following Formula (2),

(2)

(in Formula (2), $Ar_{21}$ represents an (n+1)-valent aromatic hydrocarbon group or an (n+1)-valent aromatic heterocyclic group which may have a substituent, $Ar_{22}$ represents an aromatic hydrocarbon group or an aromatic heterocyclic group which may have a substituent, n represents an integer of 1 to 3, in a case where n is an integer of equal to or greater than 2, a plurality of $Ar_{22}$'s may be the same as or different from each other, and

* represents a binding position), the total number of carbon atoms of an aromatic hydrocarbon structure and an aromatic heterocyclic structure contained in $R_1$ is 15 to 30, and each of $R_2$, $R_4$ to $R_7$, $R_9$, $R_{12}$ to $R_{19}$ and $R_{22}$ to $R_{29}$ independently represents a hydrogen atom or a substituent).

2. The photoelectric conversion element according to claim 1,
wherein the photoelectric conversion film contains a compound represented by the following Formula (W),

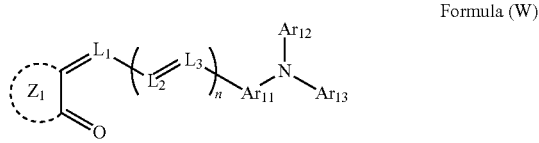

Formula (W)

(in Formula (W), $Z_1$ is a ring containing at least two carbon atoms and represents a 5-membered ring, a 6-membered ring, or a condensed ring containing at least any of a 5-membered ring and a 6-membered ring, $Z_1$ may have a substituent, each of $L_1$, $L_2$, and $L_3$ independently represents a methine group which may have a substituent, n represents an integer of equal to or greater than 0, $Ar_{11}$ represents an arylene group or a heteroarylene group which may have a substituent, $Ar_{11}$ and $L_1$ may form a ring by being bonded to each other, and the ring formed by $Ar_{11}$ and $L_1$ bonded to each other may have a substituent, each of $Ar_{12}$ and $Ar_{13}$ independently represents an aryl group or a heteroaryl group which may have a substituent, and $Ar_{11}$ and $Ar_{12}$, $A_{r11}$ and $Ar_{13}$, or $Ar_{12}$ and $Ar_{13}$ may form a ring by being bonded to each other).

3. A photosensor comprising the photoelectric conversion element according to claim 1.

4. An imaging device comprising the photoelectric conversion element according to claim 1.

5. The photoelectric conversion element according to claim 1,
wherein $R_1$ is a condensed-ring aromatic hydrocarbon group which may have a substituent, and the condensed ring constituting the condensed-ring aromatic hydrocarbon group consists of four or more benzene rings.

6. The photoelectric conversion element according to claim 5,
wherein the photoelectric conversion film contains a compound represented by the following Formula (W),

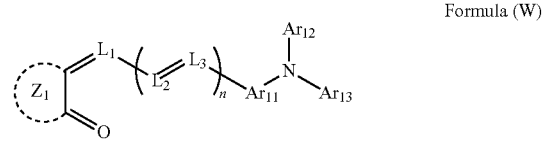

Formula (W)

(in Formula (W), $Z_1$ is a ring containing at least two carbon atoms and represents a 5-membered ring, a 6-membered ring, or a condensed ring containing at least any of a 5-membered ring and a 6-membered ring, $Z_1$ may have a substituent, each of $L_1$, $L_2$, and $L_3$ independently represents a methine group which may have a substituent, n represents an integer of equal to or greater than 0, $Ar_{11}$ represents an arylene group or a heteroarylene group which may have a substituent, $Ar_{11}$ and $L_1$ may form a ring by being bonded to each other, and the ring formed by $Ar_{11}$ and $L_1$ bonded to each other may have a substituent, each of $Ar_{12}$ and $Ar_{13}$ independently represents an aryl group or a heteroaryl group which may have a substituent, and $Ar_{11}$ and $Ar_{12}$, $Ar_{11}$ and $Ar_{13}$, or $Ar_{12}$ and $Ar_{13}$ may form a ring by being bonded to each other).

7. An imaging device comprising the photoelectric conversion element according to claim 5.

8. The photoelectric conversion element according to claim 1, wherein $R_1$ is a group represented by the following Formula (A),

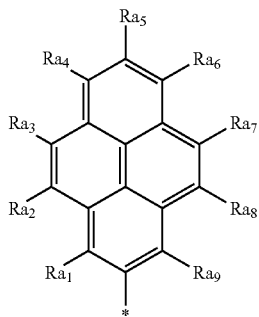

(A)

(in Formula (A), each of $Ra_1$ to $Ra_9$ independently represents a hydrogen atom or a substituent, and

* represents a binding position).

9. The photoelectric conversion element according to claim 8, wherein the photoelectric conversion film contains a compound represented by the following Formula (W),

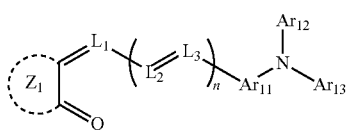

Formula (W)

(in Formula (W), $Z_1$ is a ring containing at least two carbon atoms and represents a 5-membered ring, a 6-membered ring, or a condensed ring containing at least any of a 5-membered ring and a 6-membered ring, $Z_1$ may have a substituent, each of $L_1$, $L_2$, and $L_3$ independently represents a methine group which may have a substituent, n represents an integer of equal to or greater than 0, $Ar_{11}$ represents an arylene group or a heteroarylene group which may have a substituent, $Ar_{11}$ and $L_1$ may form a ring by being bonded to each other, and the ring formed by $Ar_{11}$ and $L_1$ bonded to each other may have a substituent, each of $Ar_{12}$ and $Ar_{13}$ independently represents an aryl group or a heteroaryl group which may have a substituent, and $Ar_{11}$ and $Ar_{12}$, $Ar_{11}$ and $Ar_{13}$, or $Ar_{12}$ and $Ar_{13}$ may form a ring by being bonded to each other).

10. An imaging device comprising the photoelectric conversion element according to claim 8.

11. The photoelectric conversion element according to claim 1, wherein $R_1$ is a group represented by the following Formula (C),

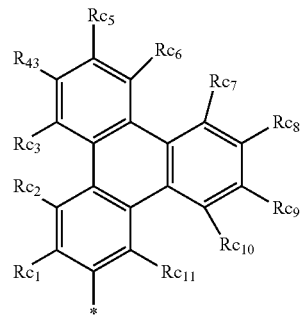

(C)

(in Formula (C), each of $Rc_1$ to $Rc_{11}$ independently represent a hydrogen atom or a substituent, and

* represents a binding position).

12. The photoelectric conversion element according to claim 11, wherein the photoelectric conversion film contains a compound represented by the following Formula (W),

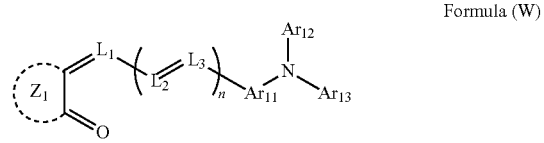

Formula (W)

(in Formula (W), $Z_1$ is a ring containing at least two carbon atoms and represents a 5-membered ring, a 6-membered ring, or a condensed ring containing at least any of a 5-membered ring and a 6-membered ring, $Z_1$ may have a substituent, each of $L_1$, $L_2$, and $L_3$ independently represents a methine group which may have a substituent, n represents an integer of equal to or greater than 0, $Ar_{11}$ represents an arylene group or a heteroarylene group which may have a substituent, $Ar_{11}$ and $L_1$ may form a ring by being bonded to each other, and the ring formed by $Ar_{11}$ and $L_1$ bonded to each other may have a substituent, each of $Ar_{12}$ and $Ar_{13}$ independently represents an aryl group or a heteroaryl group which may have a substituent, and $Ar_{11}$ and $Ar_{12}$, $Ar_{11}$ and $Ar_{13}$, or $Ar_{12}$ and $Ar_{13}$ may form a ring by being bonded to each other).

13. An imaging device comprising the photoelectric conversion element according to claim 11.

14. A photoelectric conversion element comprising:

a transparent conductive film;

a conductive film; and a photoelectric conversion film and an electron blocking layer which are disposed between the transparent conductive film and the conductive film, wherein the electron blocking layer contains a compound represented by the following Formula (1),

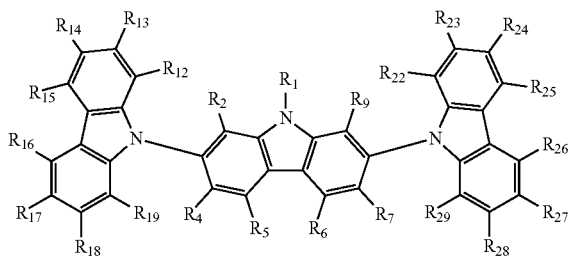

(1)

(in Formula (1), $R_1$ is a group represented by the following Formula (B),

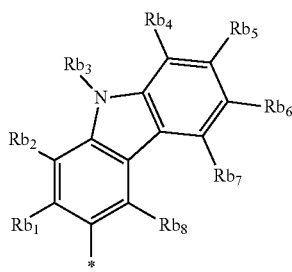

(B)

(in Formula (B), each of $Rb_1$ to $Rb_8$ independently represents a hydrogen atom or a substituent, and
* represents a binding position), and
each of $R_2$, $R_4$ to $R_7$, $R_9$, $R_{12}$ to $R_{19}$, and $R_{22}$ to $R_{29}$ independently represents a hydrogen atom or a substituent).

15. The photoelectric conversion element according to claim 14,
wherein the photoelectric conversion film contains a compound represented by the following Formula (W),

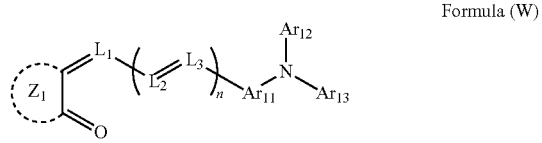

Formula (W)

(in Formula (W), $Z_1$ is a ring containing at least two carbon atoms and represents a 5-membered ring, a 6-membered ring, or a condensed ring containing at least any of a 5-membered ring and a 6-membered ring, $Z_1$ may have a substituent, each of $L_1$, $L_2$, and $L_3$ independently represents a methine group which may have a substituent, n represents an integer of equal to or greater than 0, $Ar_{11}$ represents an arylene group or a heteroarylene group which may have a substituent, $Ar_{11}$ and $L_1$ may form a ring by being bonded to each other, and the ring formed by $Ar_{11}$ and $L_1$ bonded to each other may have a substituent, each of $Ar_{12}$ and $Ar_{13}$ independently represents an aryl group or a heteroaryl group which may have a substituent, and $Ar_{11}$ and $Ar_{12}$, $Ar_{11}$ and $Ar_{13}$, or $Ar_{12}$ and $Ar_{13}$ may form a ring by being bonded to each other).

16. An imaging device comprising the photoelectric conversion element according to claim 14.

* * * * *